(12) United States Patent
Park et al.

(10) Patent No.: US 10,262,949 B2
(45) Date of Patent: *Apr. 16, 2019

(54) FAN-OUT SEMICONDUCTOR PACKAGE AND METHOD OF MANUFACTURING THE SAME

(71) Applicant: SAMSUNG ELECTRO-MECHANICS CO., LTD., Suwon-Si, Gyeonggi-Do (KR)

(72) Inventors: Dae Hyun Park, Suwon-Si (KR); Han Kim, Suwon-Si (KR); Kang Heon Hur, Suwon-Si (KR); Young Gwan Ko, Suwon-Si (KR); Jung Ho Shim, Suwon-Si (KR)

(73) Assignee: Samsung Electro-Mechanics Co., Ltd., Suwon-si, Gyeonggi-do (KR)

(*) Notice: Subject to any disclaimer, the term of this patent is extended or adjusted under 35 U.S.C. 154(b) by 0 days.

This patent is subject to a terminal disclaimer.

(21) Appl. No.: 15/944,321

(22) Filed: Apr. 3, 2018

(65) Prior Publication Data
US 2018/0226351 A1    Aug. 9, 2018

Related U.S. Application Data

(63) Continuation of application No. 15/297,831, filed on Oct. 19, 2016, now Pat. No. 9,984,979, which is a
(Continued)

(30) Foreign Application Priority Data

May 11, 2015  (KR) .................. 10-2015-0065177
Oct. 5, 2015  (KR) .................. 10-2015-0139682
Apr. 19, 2016  (KR) .................. 10-2016-0047455

(51) Int. Cl.
*H05K 7/00* (2006.01)
*H01L 23/538* (2006.01)
(Continued)

(52) U.S. Cl.
CPC ........ *H01L 23/5389* (2013.01); *H01L 21/486* (2013.01); *H01L 21/4853* (2013.01);
(Continued)

(58) Field of Classification Search
CPC ..... H01L 2224/48091; H01L 2924/181; H01L 2924/00012; H01L 2924/00014;
(Continued)

(56) References Cited

U.S. PATENT DOCUMENTS 8,064,215 B2 * 11/2011 Chung ................ H01L 23/3114
                                                        174/260
8,227,927 B2  7/2012 Chen et al.
(Continued)

FOREIGN PATENT DOCUMENTS

JP    2003-309213 A    10/2003
JP    2003-309243 A    10/2003
(Continued)

OTHER PUBLICATIONS

Final Office Action issued in related U.S. Appl. No. 15/144,162, dated May 29, 2018.
(Continued)

*Primary Examiner* — Yuriy Semenenko
(74) *Attorney, Agent, or Firm* — Morgan Lewis & Bockius LLP

(57) ABSTRACT

The present disclosure relates to a fan-out semiconductor package and a method of manufacturing the same. The fan-out semiconductor package includes: a first connection member having a through-hole; a semiconductor chip disposed in the through-hole; an encapsulant encapsulating at least portions of the first connection member and the semiconductor chip; and a second connection member disposed on the first connection member and the semiconductor chip. The first connection member includes a first insulating layer,
(Continued)

a first redistribution layer and a second redistribution layer disposed on one surface and the other surface of the first insulating layer opposing the one surface thereof, respectively, a second insulating layer disposed on the first insulating layer and covering the first redistribution layer, and a third redistribution layer disposed on the second insulating layer. A fan-out semiconductor package may include one or more connection units instead of the first connection member.

40 Claims, 33 Drawing Sheets

Related U.S. Application Data continuation-in-part of application No. 15/144,162, filed on May 2, 2016.

(51) Int. Cl.
| | |
|---|---|
| *H01L 25/10* | (2006.01) |
| *H01L 21/48* | (2006.01) |
| *H01L 25/00* | (2006.01) |
| *H01L 21/683* | (2006.01) |
| *H01L 23/48* | (2006.01) |
| *H01L 23/00* | (2006.01) |
| *H05K 1/02* | (2006.01) |
| *H05K 1/18* | (2006.01) |
| *H01L 21/56* | (2006.01) |
| *H01L 23/31* | (2006.01) |

(52) U.S. Cl.
CPC ...... *H01L 21/4857* (2013.01); *H01L 21/6836* (2013.01); *H01L 23/48* (2013.01); *H01L 23/5383* (2013.01); *H01L 23/5384* (2013.01); *H01L 23/5386* (2013.01); *H01L 24/00* (2013.01); *H01L 24/19* (2013.01); *H01L 24/20* (2013.01); *H01L 25/105* (2013.01); *H01L 25/50* (2013.01); *H01L 21/568* (2013.01); *H01L 23/3128* (2013.01); *H01L 24/48* (2013.01); *H01L 2221/68372* (2013.01); *H01L 2221/68386* (2013.01); *H01L 2224/0401* (2013.01); *H01L 2224/04105* (2013.01); *H01L 2224/05569* (2013.01); *H01L 2224/05572* (2013.01); *H01L 2224/12105* (2013.01); *H01L 2224/16238* (2013.01); *H01L 2224/24137* (2013.01); *H01L 2224/32225* (2013.01); *H01L 2224/48091* (2013.01); *H01L 2224/48227* (2013.01); *H01L 2224/73204* (2013.01); *H01L 2225/1035* (2013.01); *H01L 2225/1041* (2013.01); *H01L 2225/1058* (2013.01); *H01L 2924/15311* (2013.01); *H01L 2924/181* (2013.01); *H01L 2924/18162* (2013.01); *H01L 2924/19041* (2013.01); *H01L 2924/19105* (2013.01); *H01L 2924/19106* (2013.01); *H01L 2924/3511* (2013.01); *H05K 1/0271* (2013.01); *H05K 1/185* (2013.01); *H05K 2201/10674* (2013.01)

(58) Field of Classification Search
CPC ............. H01L 21/4853; H01L 21/4857; H01L 21/486; H01L 21/568; H01L 21/6836; H01L 2221/68372; H01L 2221/68386; H01L 2224/0401
See application file for complete search history.

(56) References Cited

U.S. PATENT DOCUMENTS

| | | |
|---|---|---|
| 8,320,134 B2 | 11/2012 | Su et al. |
| 8,432,022 B1 | 4/2013 | Huemoeller et al. |
| 8,704,365 B2 | 4/2014 | Park et al. |
| 8,736,033 B1 | 5/2014 | Chuo et al. |
| 8,941,230 B2 | 1/2015 | Kyozuka et al. |
| 2007/0045821 A1 | 3/2007 | Cho et al. |
| 2007/0096292 A1 | 5/2007 | Machida |
| 2008/0048309 A1 | 2/2008 | Corisis et al. |
| 2009/0085192 A1 | 4/2009 | Hsu et al. |
| 2009/0218118 A1* | 9/2009 | Tani ............... H01L 23/5389 174/256 |
| 2009/0237900 A1* | 9/2009 | Origuchi ......... H01L 23/49838 361/763 |
| 2010/0159647 A1 | 6/2010 | Ito et al. |
| 2010/0301474 A1 | 12/2010 | Yang |
| 2011/0024899 A1 | 2/2011 | Masumoto et al. |
| 2011/0068459 A1 | 3/2011 | Pagaila et al. |
| 2011/0215464 A1 | 9/2011 | Guzek et al. |
| 2012/0313226 A1* | 12/2012 | Koizumi ........ H01L 23/49827 257/659 |
| 2013/0106549 A1 | 5/2013 | Nezu et al. |
| 2013/0249115 A1 | 9/2013 | Lin et al. |
| 2014/0070396 A1* | 3/2014 | Kyozuka ............ H01L 24/19 257/698 |
| 2014/0291859 A1 | 10/2014 | Kiwanami et al. |
| 2014/0360765 A1* | 12/2014 | Kiwanami ............ H05K 1/185 174/260 |
| 2015/0001708 A1 | 1/2015 | Lin |
| 2015/0016078 A1 | 1/2015 | Yang et al. |
| 2015/0062848 A1 | 3/2015 | Lee et al. |
| 2015/0200185 A1* | 7/2015 | Yu ..................... H01L 24/17 257/737 |
| 2015/0364394 A1 | 12/2015 | Lin |
| 2016/0027766 A1 | 1/2016 | Chung |
| 2016/0081194 A1 | 3/2016 | Sato et al. |

FOREIGN PATENT DOCUMENTS

| | | |
|---|---|---|
| JP | 2007-123524 A | 5/2007 |
| JP | 2014-056925 A | 3/2014 |
| JP | 2014-192452 A | 10/2014 |
| JP | 2015-050457 A | 3/2015 |
| KR | 10-2012-0098844 A | 9/2012 |
| TW | I343105 B | 6/2006 |
| WO | 2011/090570 A2 | 7/2011 |

OTHER PUBLICATIONS

Non-Final Office Action issued in related U.S. Appl. No. 15/144,162, dated Nov. 9, 2017.
Notice of Allowance issued in related U.S. Appl. No. 15/297,831, dated Jan. 30, 2018.
Non-Final Office Action issued in related U.S. Appl. No. 15/144,162, dated Mar. 8, 2018.
Notice of allowance issued in related U.S. Appl. No. 15/144,162, dated Sep. 27, 2018.
Office Action issued incorresponding Japanese Patent Application No. 2016-093940, dated Jun. 5, 2018.
Office Action issued in related U.S. Appl. No. 15/877,021, dated Jul. 19, 2018.
Korean Office Action issued in Application No. 10-2016-0047455 dated Dec. 17, 2018, with English translation.
Taiwanese Office Action dated Feb. 14, 2019 issued in Taiwanese Patent Application No. 105114045.

\* cited by examiner

I-I'

II-II'

III-III'

V – V'

FAN-OUT SEMICONDUCTOR PACKAGE AND METHOD OF MANUFACTURING THE SAME

CROSS-REFERENCE TO RELATED APPLICATION(S)

This application is a Continuation of U.S. patent application Ser. No. 15/297,831, filed on Oct. 19, 2016, which is a Continuation-in-Part of U.S. patent application Ser. No. 15/144,162, filed on May 2, 2016, which claims benefit of priority to Korean Patent Application Nos. 10-2015-0065177 filed on May 11, 2015 and 10-2015-0139682 filed on Oct. 5, 2015 in the Korean Intellectual Property Office, and this application also claims benefit of priority to Korean Patent Application No. 10-2016-0047455 filed on Apr. 19, 2016 in the Korean Intellectual Property Office. The disclosures of all the related applications are incorporated herein by reference in their entirety.

TECHNICAL FIELD

The present disclosure relates to a semiconductor package, and more particularly, to a fan-out semiconductor package in which connection terminals may be extended outwardly of a region in which a semiconductor chip is disposed, and a method of manufacturing the same.

BACKGROUND

One significant recent trend in the development of technology related to semiconductor chips is reducing the size of semiconductor chips. Hence, in the field of packaging, in accordance with a rapid increase in demand for small semiconductor chips, or the like, the implementation of a semiconductor package having a compact size and including a plurality of pins has been demanded.

One type of package technology suggested in order to satisfy the technical demand as described above is a fan-out semiconductor package. Such a fan-out semiconductor package has a compact size and may allow a plurality of pins to be implemented by redistributing connection terminals outwardly of a region in which a semiconductor chip is disposed.

SUMMARY

An aspect of the present disclosure may provide a fan-out semiconductor package in which a problem in which a semiconductor chip yield is reduced may be solved, and a method of manufacturing the same.

An aspect of the present disclosure may provide a fan-out semiconductor package in which a redistribution layer that may perform a redistribution function of a semiconductor chip is provided before the semiconductor chip is disposed.

According to an aspect of the present disclosure, a fan-out semiconductor package may include: a first connection member having a through-hole; a semiconductor chip disposed in the through-hole and having an active surface having connection pads disposed thereon and an inactive surface opposing the active surface; an encapsulant encapsulating at least portions of the first connection member and the inactive surface of the semiconductor chip; and a second connection member disposed on the first connection member and the active surface of the semiconductor chip and including a redistribution layer electrically connected to the connection pads. The first connection member includes a first insulating layer, a first redistribution layer and a second redistribution layer disposed on one surface and the other surface of the first insulating layer opposing the one surface thereof, respectively, a second insulating layer disposed on the first insulating layer and covering the first redistribution layer, and a third redistribution layer disposed on the second insulating layer. The first to third redistribution layers are electrically connected to the connection pads.

According to another aspect of the present disclosure, a fan-out semiconductor package may include: a semiconductor chip having an active surface having connection pads disposed thereon and an inactive surface opposing the active surface; one or more connection units disposed adjacently to the semiconductor chip; and a connection member disposed on the connection units and the semiconductor chip. Each of the connection units includes a first insulating layer, a first redistribution layer and a second redistribution layer disposed on one surface and the other surface of the first insulating layer, respectively, a second insulating layer disposed on the first insulating layer and covering the first redistribution layer, and a third redistribution layer disposed on the second insulating layer. The connection member includes an insulating layer and a redistribution layer disposed on the insulating layer. The first to third redistribution layers of each of the connection units and the redistribution layer of the connection member are electrically connected to the connection pads of the semiconductor chip.

According to another aspect of the present disclosure, a method of manufacturing a fan-out semiconductor package may include: forming a first connection member by preparing a first insulating layer, forming a first redistribution layer and a second redistribution layer on one surface and the other surface of the first insulating layer, respectively, forming a second insulating layer covering the first redistribution layer on the first insulating layer, forming a third redistribution layer on the second insulating layer, and forming a through-hole penetrating through the first and second insulating layers; disposing a semiconductor chip in the through-hole, the semiconductor chip having an active surface having connection pads disposed thereon and an inactive surface opposing the active surface; forming an encapsulant encapsulating at least portions of the first connection member and the inactive surface of the semiconductor chip; and forming a second connection member on the first connection member and the active surface of the semiconductor chip, the second connection member including a redistribution layer electrically connected to the connection pads, wherein the first to third redistribution layers are electrically connected to the connection pads, and the first to third redistribution layers are formed before the disposing of the semiconductor chip.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
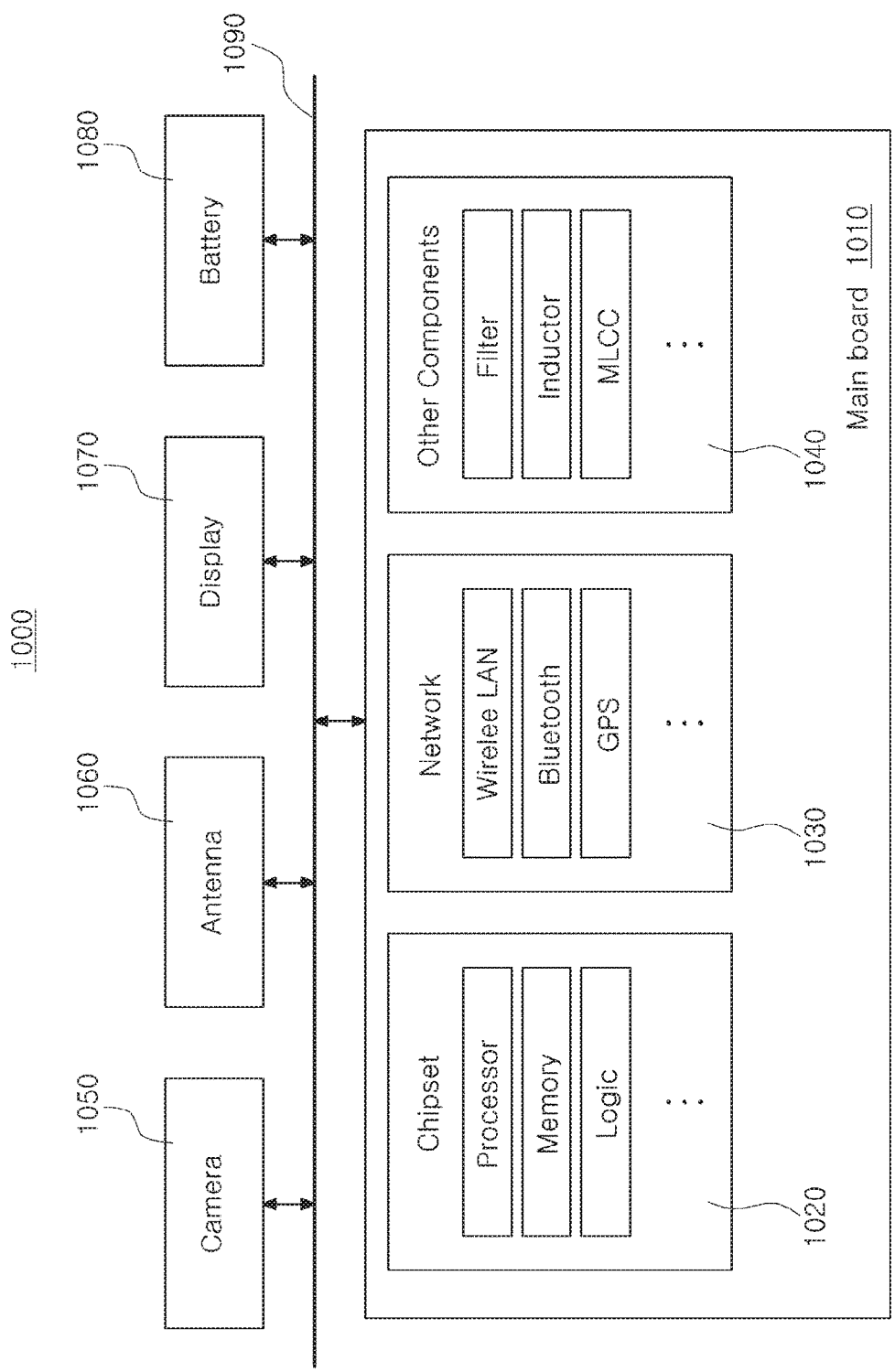
FIG. 1 is a schematic block diagram illustrating an example of an electronic device system.

Hereinafter, exemplary embodiments of the present disclosure will be described in detail with reference to the accompanying drawings.

The term "an exemplary embodiment" used herein does not refer to the same exemplary embodiment, and is provided to emphasize a particular feature or characteristic different from that of another exemplary embodiment However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein. That is, exemplary embodiments may be freely combined with each other.

The meaning of a "connection" of a component to another component in the description includes an indirect connection through a third component as well as a direct connection between two components. In addition, "electrically connected" means the concept including a physical connection and a physical disconnection. It can be understood that when an element is referred to with "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

Herein, an upper portion, a lower portion, an upper side, a lower side, an upper surface, a lower surface, and the like, are decided in the attached drawings. For example, a first connection member is disposed on a level above a redistribution layer. However, the claims are not limited thereto. In addition, a vertical direction refers to the abovementioned upward and downward directions, and a horizontal direction refers to a direction perpendicular to the abovementioned upward and downward directions. In this case, a vertical cross section refers to a case taken along a plane in the vertical direction, and an example thereof may be a cross-sectional view illustrated in the drawings. In addition, a horizontal cross section refers to a case taken along a plane in the horizontal direction, and an example thereof may be a plan view illustrated in the drawings.

Terms used herein are used only in order to describe an exemplary embodiment rather than limiting the present disclosure. In this case, singular forms include plural forms unless interpreted otherwise in context.

Electronic Device

FIG. 1 is a schematic block diagram illustrating an example of an electronic device system.

Referring to FIG. 1, an electronic device 1000 may accommodate a main board 1010 therein. The main board 1010 may include chip-related components 1020, network related components 1030, other components 1040, and the like, physically or electrically connected thereto. These components may be connected to others to be described below to form various signal lines 1090.

The chip-related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphic processor (for example, a graphic processing unit (GPU)), a digital signal processor, a cryptographic processor, a micro processor, a micro controller, or the like; and a logic chip such as an analog-to-digital converter, an application-specific integrated circuit (ASIC), or the like. However, the chip-related components 1020 are not limited thereto, but may also include other types of chip-related components. In addition, the chip-related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network related components 1030 are not limited thereto, but may also include a variety of other wireless or wired standards or protocols. In addition, the network related components 1030 may be combined with each other, together with the chip-related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip-related components 1020 or the network related components 1030 described above.

Depending on type of the electronic device 1000, the electronic device 1000 may include other components that may or may not be physically or electrically connected to the main board 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on the type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive device, or the like. However, the electronic device 1000 is not limited thereto, and may be any other electronic device processing data.

Figure 2:
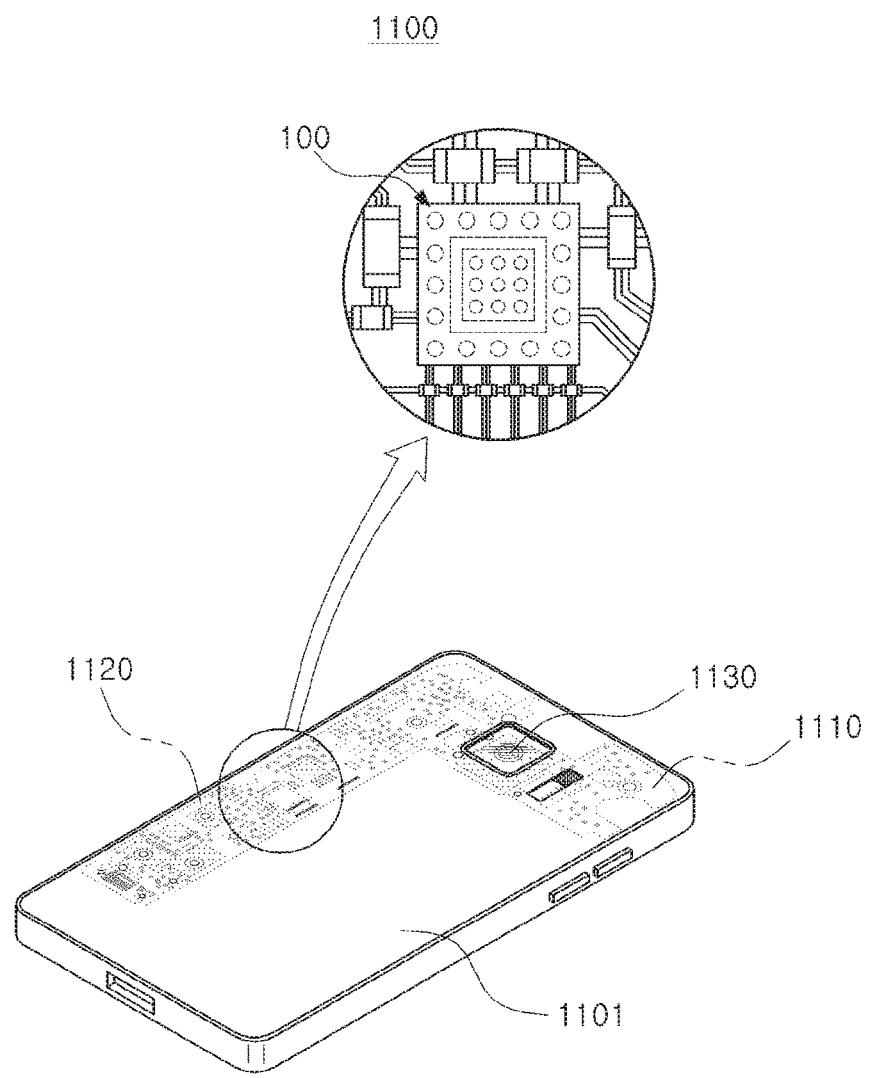
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a main board 1110 may be accommodated in a body 1101 of a smartphone 1100, and various electronic components 1120 may be physically or electrically connected to the main board 1110. In addition, other components that may or may not be physically or electrically connected to the main board 1110, such as the camera module 1050, may be accommodated in the body 1101. A portion of the electronic components 1120 may be chip-related components, and, among the chip-related components, the semiconductor package 100 may be, for example, an application processor, but is not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a semiconductor finished product alone, and may be damaged due to external physical or chemical impact. Therefore, the semiconductor chip is not used alone, but is packaged and is used in an electronic device, or the like, in a packaged state.

Semiconductor packaging is required as there may be a difference in a circuit width between the semiconductor chip and a main board of the electronic device in terms of electrical connection. In detail, a size of connection pads of the semiconductor chip and an interval between the connection pads of the semiconductor chip are very fine, but a size of component mounting pads of the main board used in the electronic device and an interval between the component mounting pads of the main board are significantly larger than those of the semiconductor chip. Therefore, it may be difficult to directly mount the semiconductor chip on the main board, and a packaging technology for buffering a difference in a circuit width between the semiconductor chip and the main board is required.

A semiconductor package manufactured by the packaging technology may be divided into a fan-in semiconductor package and a fan-out semiconductor package depending on a structure and a purpose thereof.

The fan-in semiconductor package and the fan-out semiconductor package will hereinafter be described in more detail with reference to the drawings.

Fan-in Semiconductor Package

Figure 3B:
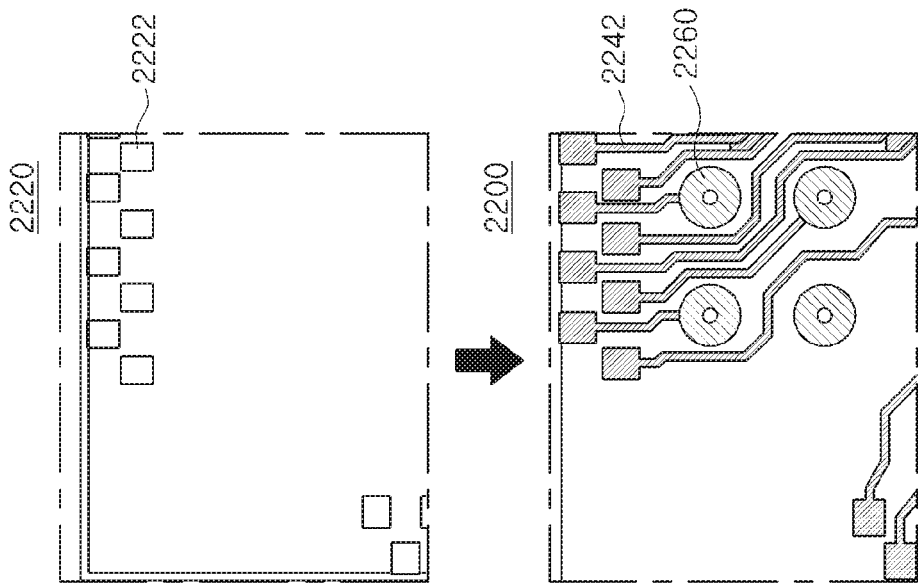
FIGS. 3A and 3B are schematic cross-sectional views illustrating states of a fan-in semiconductor package before and after being packaged.
Figure 3A:
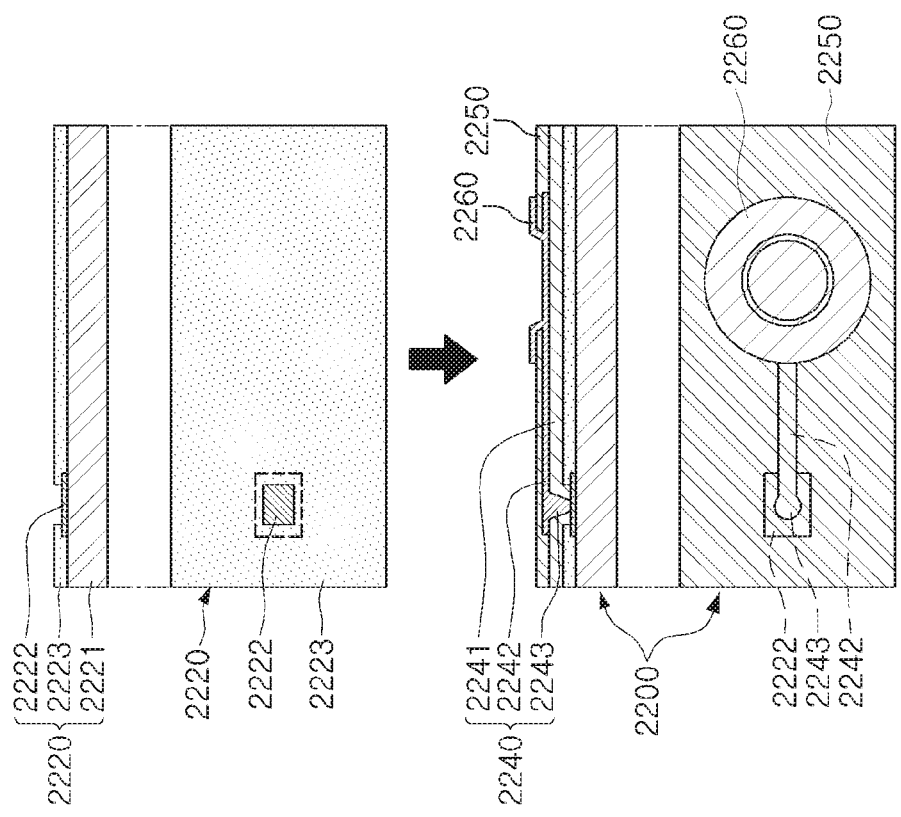

FIGS. 3A and 3B are schematic cross-sectional views illustrating states of a fan-in semiconductor package before and after being packaged.

Figure 4:
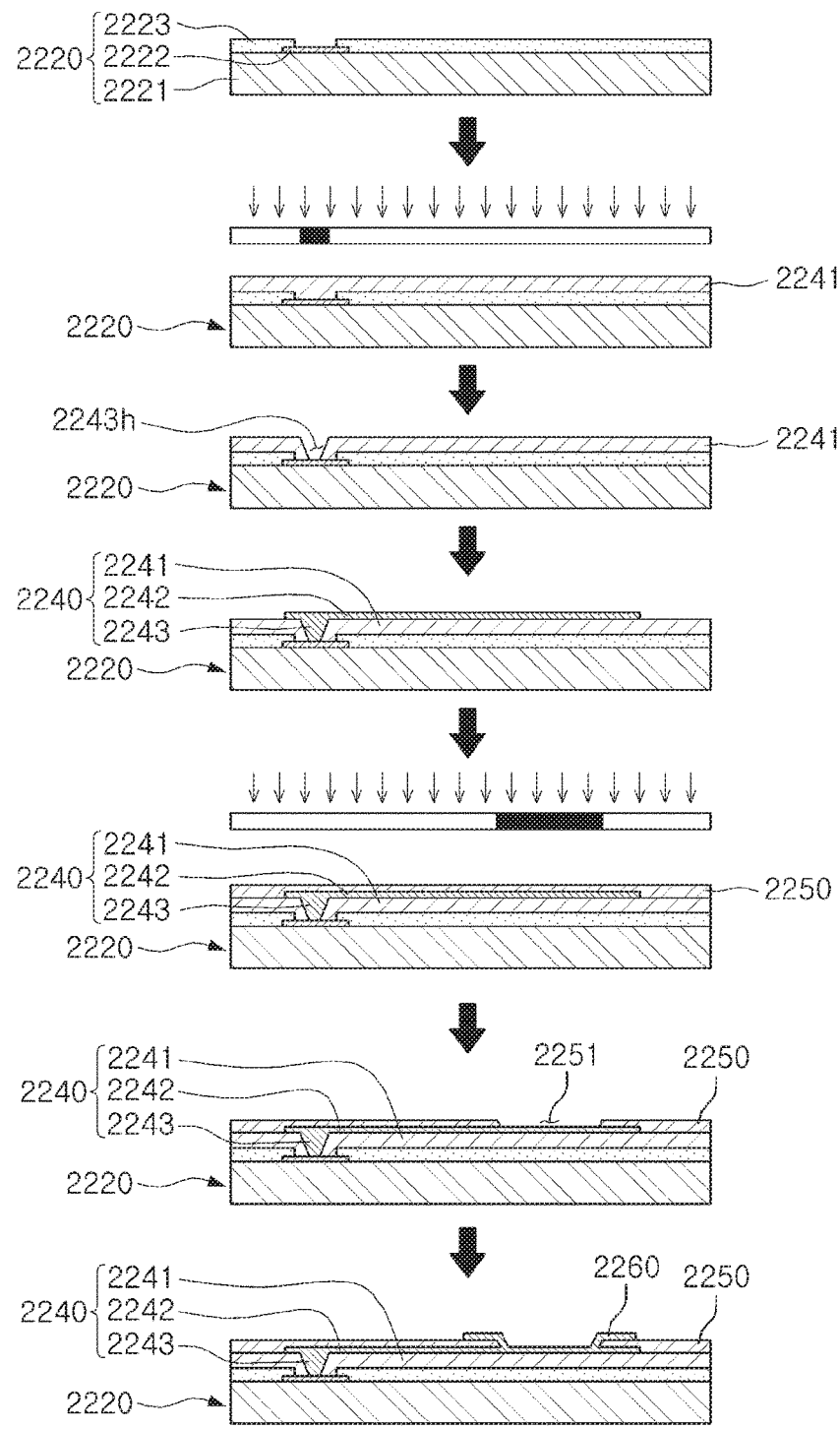
FIG. 4 is a schematic cross-sectional view illustrating a packaging process of a fan-in semiconductor package.

FIG. 4 is a schematic cross-sectional view illustrating a packaging process of a fan-in semiconductor package.

Referring to the drawings, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. Here, since the connection pads 2222 are very small, it is difficult to mount the integrated circuit (IC) on an intermediate level printed circuit board (PCB) as well as on the main board of the electronic device, or the like.

Therefore, a connection member 2240 may be formed on the semiconductor chip 2220, depending on a size of the semiconductor chip 2220, in order to redistribute the connection pads 2222. The connection member 2240 may be formed by forming an insulating layer 2241 on the semiconductor chip 2220 using an insulating material such as a photoimagable dielectric (PID) resin, forming via holes 2243*h* opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in a smartphone have been manufactured in a fan-in semiconductor package form. In detail, many elements mounted in the smartphone have been developed to implement a rapid signal transfer while having a compact size.

However, since all of the I/O terminals need to be disposed inside the semiconductor chip in the fan-in semiconductor package, the fan-in semiconductor package has a large spatial limitation. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the main board of the electronic device. Here, even in the case that a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip are not enough to directly mount the fan-in semiconductor package on the main board of the electronic device.

Figure 5:
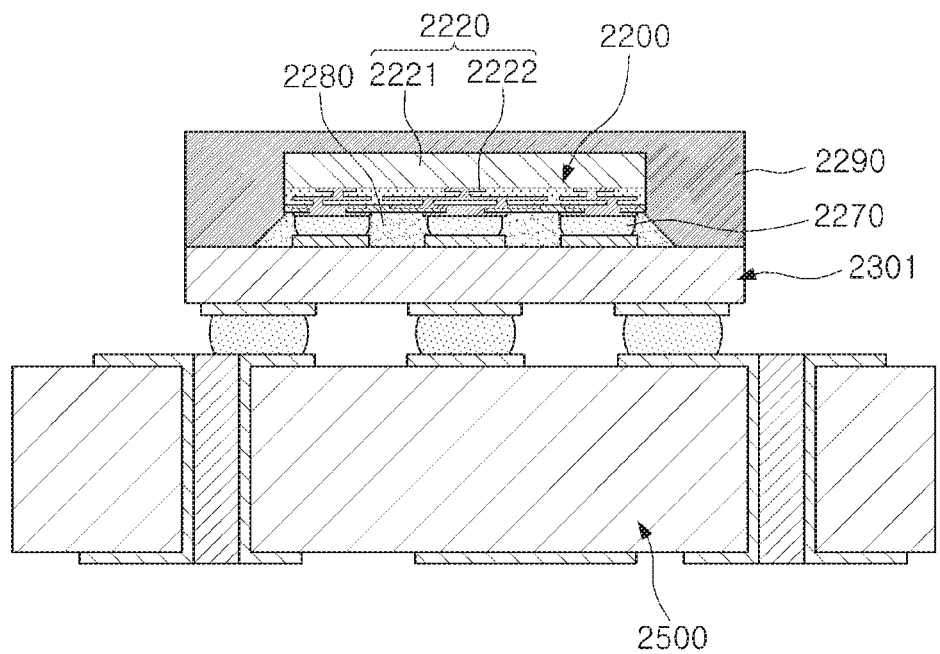
FIG. 5 is a schematic cross-sectional view illustrating a case in which a fan-in semiconductor package is mounted on an interposer substrate and is ultimately mounted on a main board of an electronic device.

FIG. 5 is a schematic cross-sectional view illustrating a case in which a fan-in semiconductor package is mounted on an interposer substrate and is ultimately mounted on a main board of an electronic device.

Figure 6:
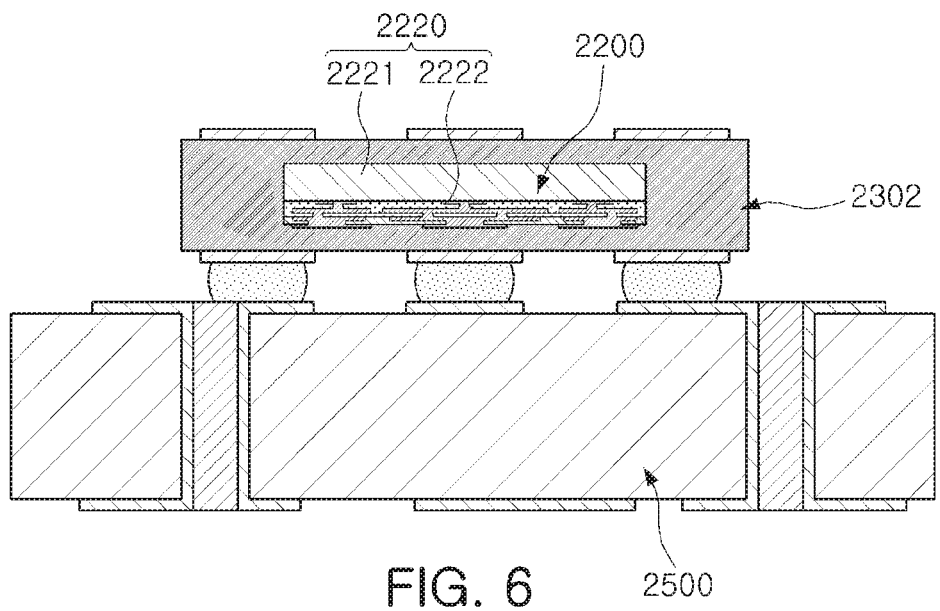
FIG. 6 is a schematic cross-sectional view illustrating a case in which a fan-in semiconductor package is embedded in an interposer substrate and is ultimately mounted on a main board of an electronic device.

FIG. 6 is a schematic cross-sectional view illustrating a case in which a fan-in semiconductor package is embedded in an interposer substrate and is ultimately mounted on a main board of an electronic device.

Referring to the drawings, in a fan-in semiconductor package 2200, connection pads 2222, that is, I/O terminals, of a semiconductor chip 2220 may be redistributed once more through an interposer substrate 2301, and the fan-in semiconductor package 2200 may be ultimately mounted on a main board 2500 of an electronic device in a state in which it is mounted on the interposer substrate 2301. Here, solder balls 2270, and the like, may be fixed by an underfill resin 2280, or the like, and an external surface of the semiconductor chip 2220 may be covered with a molding material 2290, or the like. Alternatively, a fan-in semiconductor package 2200 may be embedded in a separate interposer substrate 2302, connection pads 2222, that is, I/O terminals, of the semiconductor chip 2220 may be redistributed once more by the interposer substrate 2302 in a state in which the fan-in semiconductor package 2200 is embedded in the interposer substrate 2302, and the fan-in semiconductor package 2200 may be ultimately mounted on a main board 2500 of an electronic device.

As described above, it may be difficult to directly mount and use the fan-in semiconductor package on the main board of the electronic device. Therefore, the fan-in semiconductor package may be mounted on the separate interposer substrate and be then mounted on the main board of the electronic device through a packaging process or may be mounted and used on the main board of the electronic device in a state in which it is embedded in the interposer substrate.

Fan-Out Semiconductor Package

Figure 7:
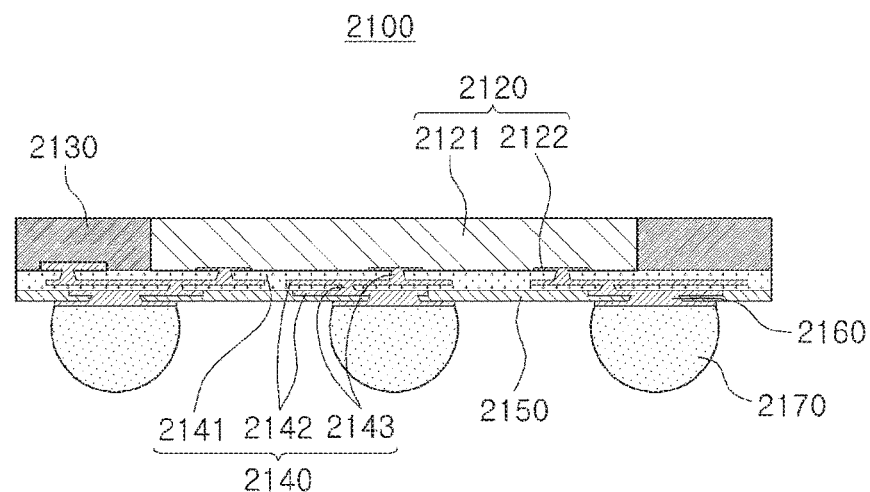
FIG. 7 is a schematic cross-sectional view illustrating a fan-out semiconductor package.

FIG. 7 is a schematic cross-sectional view illustrating a fan-out semiconductor package.

Referring to the drawing, in a fan-out semiconductor package 2100, for example, an external surface of a semiconductor chip 2120 may be protected by an encapsulant 2130, and connection pads 2122 of the semiconductor chip 2120 may be redistributed up to the external surface of the semiconductor chip 2120 by a connection member 2140. In this case, a passivation layer 2150 may further be formed on the connection member 2140, and underbump metal layers 2160 may further be formed in openings of the passivation layer 2150. Solder balls 2170 may further be formed on the underbump metal layers 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed up outwardly of the semiconductor chip through the connection member formed on the semiconductor chip. As described above, in the fan-in semiconductor package, all of the I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed up to the external surface of the semiconductor chip through the connection member formed on the semiconductor chip as described above. Therefore, even in the case that a size of the semiconductor chip is decreased, a standardized ball layout may be used in the fan-out semiconductor package as it is, such that the fan-out semiconductor package may be mounted on the main board of the electronic device without using a separate interposer substrate, as described below.

Figure 8:
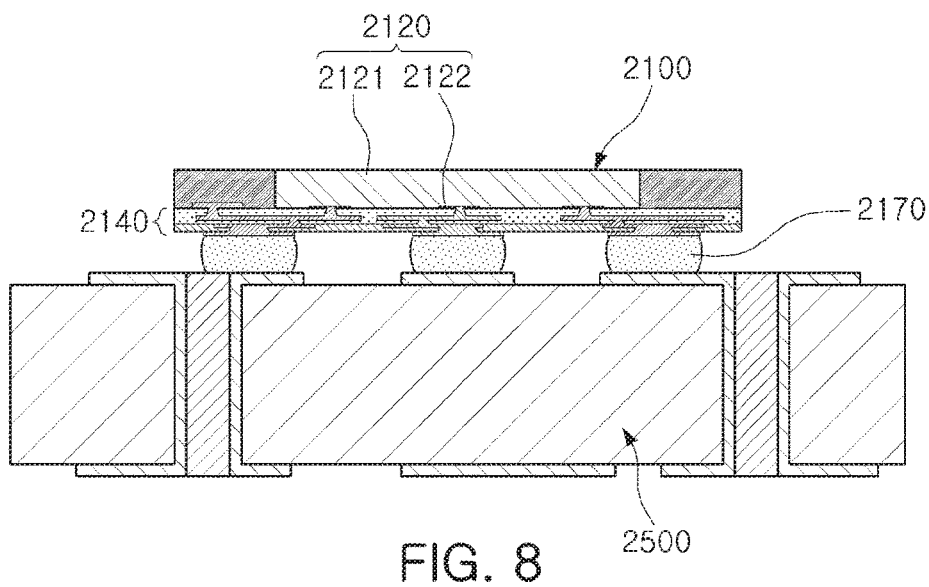
FIG. 8 is a schematic cross-sectional view illustrating a case in which a fan-out semiconductor package is mounted on a main board of an electronic device.

FIG. 8 is a schematic cross-sectional view illustrating a case in which a fan-out semiconductor package is mounted on a main board of an electronic device.

Referring to the drawing, a fan-out semiconductor package 2100 may be mounted on a main board 2500 of an electronic device through solder balls 2170, or the like. That is, as described above, the fan-out semiconductor package 2100 includes the connection member 2140 formed on the semiconductor chip 2120 and capable of redistributing the connection pads 2122 up to a fan-out region that is out of a size of the semiconductor chip 2120, such that the standardized ball layout may be used in the fan-out semiconductor package 2100 as it is. Resultantly, the fan-out semiconductor package 2100 may be mounted on the main board 2500 of the electronic device without using a separate interposer substrate, or the like.

As described above, since the fan-out semiconductor package may be mounted on the main board of the electronic device without using the separate interposer substrate, the fan-out semiconductor package may be implemented at a thickness thinner than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to occurrence of a warpage phenomenon.

Meanwhile, the fan-out semiconductor package refers to a package technology for mounting the semiconductor chip on the main board of the electronic device, or the like, as described above, and protecting the semiconductor chip from external impact, and is a concept different from that of a printed circuit board (PCB) such as an interposer substrate, or the like, having a scale, a purpose, and the like, different from those of the fan-out semiconductor package, and having the fan-in semiconductor package embedded therein.

A fan-out semiconductor package in which a problem in which a yield of a semiconductor chip is decreased may be solved, and a method of manufacturing the same will hereinafter be described with reference to the drawings.

Fan-Out Semiconductor Package

Figure 9:
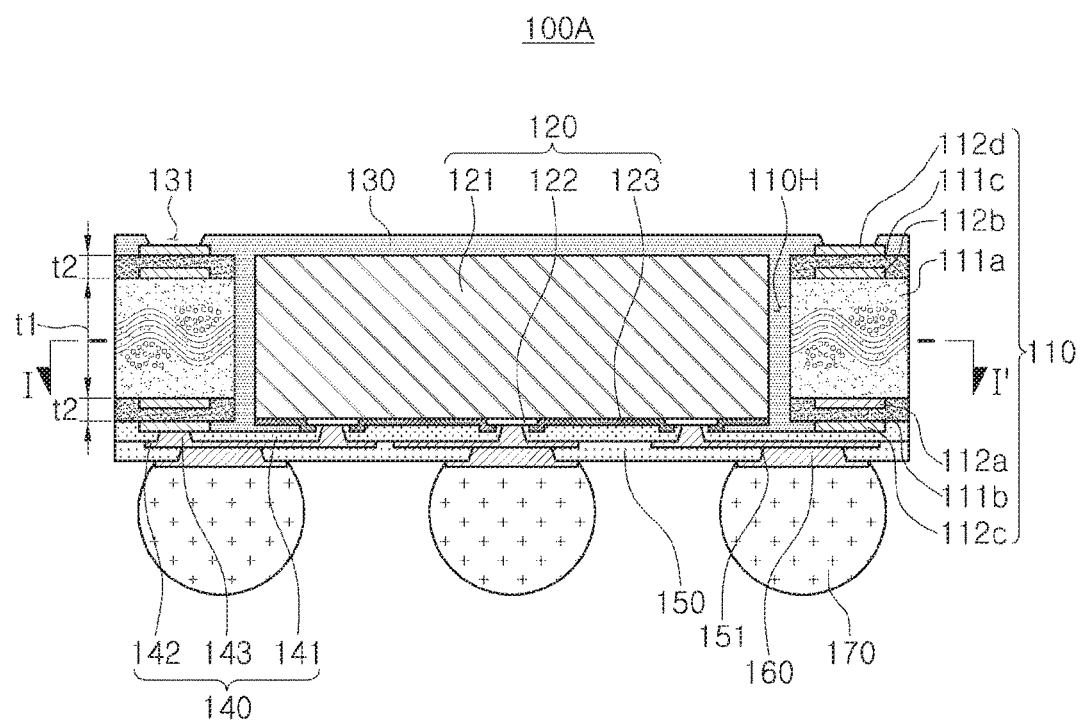
FIG. 9 is a schematic cross-sectional view illustrating an example of a fan-out semiconductor package.

FIG. 9 is a schematic cross-sectional view illustrating an example of a fan-out semiconductor package.

Figure 10:
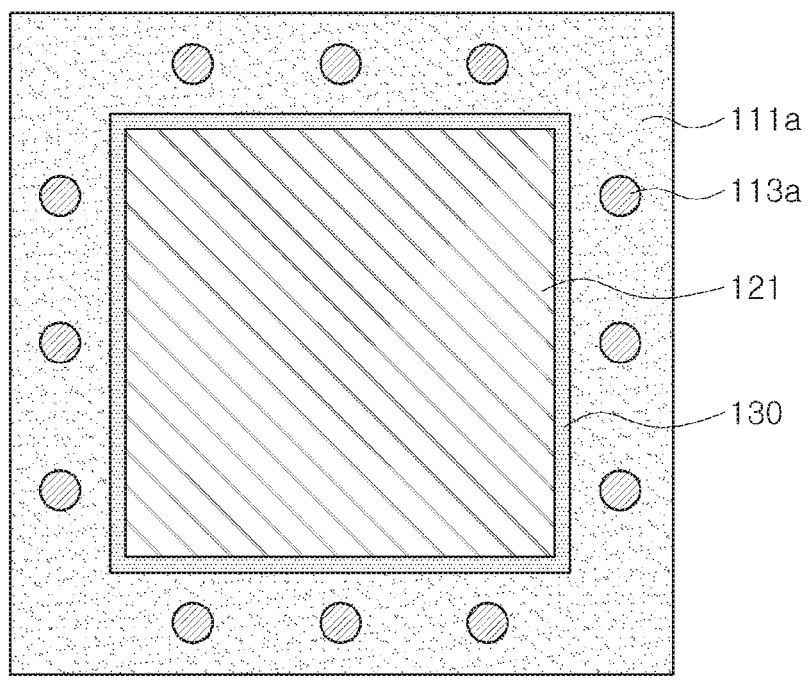
FIG. 10 is a schematic plan view taken along line I-I' of the fan-out semiconductor package of FIG. 9.
Figure 11A:
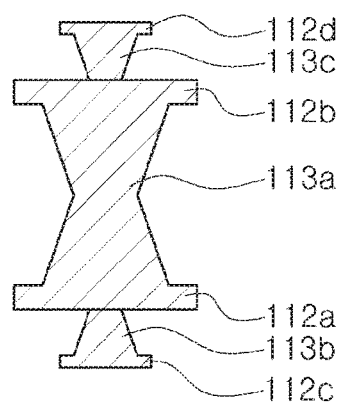
FIGS. 11A through 11D are schematic cross-sectional views illustrating various forms of vias formed in a first connection member of the fan-out semiconductor package of FIG. 9.
Figure 11B:
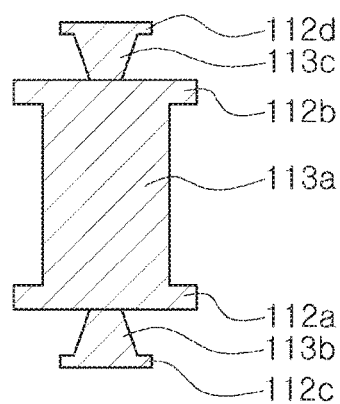
Figure 11C:
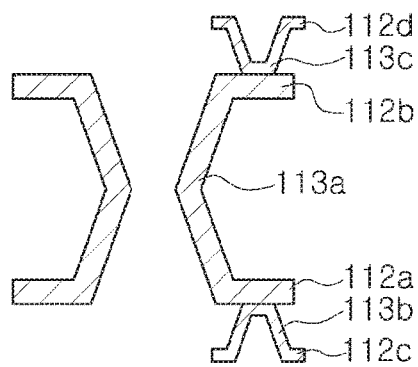
Figure 11D:
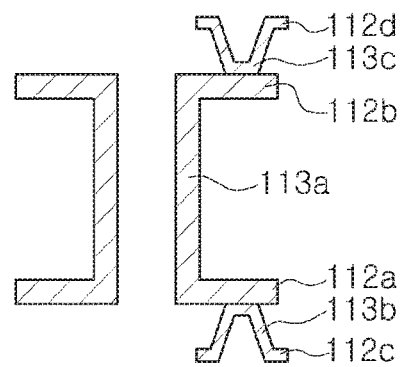

FIG. 10 is a schematic plan view taken along line I-I' of the fan-out semiconductor package of FIG. 9.

FIGS. 11A through 11D are schematic cross-sectional views illustrating various forms of vias formed in a first connection member of the fan-out semiconductor package of FIG. 9.

Referring to the drawings, a fan-out semiconductor package 100A according to an exemplary embodiment in the present disclosure may include a first connection member 110 having a through-hole 110H, a semiconductor chip 120 disposed in the through-hole 110H of the first connection member 110 and having an active surface having connection pads 122 disposed thereon and an inactive surface opposing the active surface, an encapsulant 130 encapsulating at least portions of the first connection member 110 and the inactive surface of the semiconductor chip 120, and a second connection member 140 disposed on the first connection member and the active surface of the semiconductor chip 120 and including a redistribution layer 142 electrically connected to the connection pads 122. The first connection member 110 may include a first insulating layer 111a, a first redistribution layer 112a and a second redistribution layer 112b disposed on both surfaces of the first insulating layer 111a, respectively, a second insulating layer 111b disposed on the first insulating layer 111a and covering the first redistribution layer 112a, a third redistribution layer 112c disposed on the second insulating layer 111b, a third insulating layer 111c disposed on the first insulating layer 111a and covering the second redistribution layer 112b, and a fourth redistribution layer 112d disposed on the third insulating layer 111c. The first to fourth redistribution layers 112a, 112b, 112c, and 112d may be electrically connected to the connection pads 122. The first to fourth redistribution layers 112a, 112b, 112c, and 112d may be electrically connected to each other through first to third vias 113a, 113b, and 113c each penetrating through the first to third insulating layers 111a, 111b, and 111c. The fan-out semiconductor package 100A according to the exemplary embodiment may further include a passivation layer 150 disposed on the second connection member 140, an underbump metal layer 160 disposed on openings 151 of the passivation layer 150, and connection terminals 170 disposed on the underbump metal layer 160.

Meanwhile, recently, a fan-out wafer level package having a compact size and useful for implementing a plurality of pins has been actively developed. In this case, generally, the wafer level package has a structure in which the semiconductor chip is simply molded with and surrounded by an encapsulant such as an epoxy molding compound (EMC), or the like, and a redistribution layer is formed below the wafer level package to implement redistribution of the semiconductor chip. In this case, as the number of layers implementing the redistribution layer is increased, the probability that a defect will occur in a process of forming the redistribution layer is increased. Since the semiconductor chip is generally disposed in the fan-out wafer level package before the redistribution layer is formed, when the defect occurs, the semiconductor chip should also be discarded. Therefore, the defect occurring after the semiconductor chip is disposed may cause a decrease in semiconductor chip yield. In addition, since the semiconductor chip is simply encapsulated with and surrounded by the encapsulant, it is difficult to control warpage occurring due to various causes, there is a limitation in fixing the semiconductor chip, and it is difficult to utilize an encapsulating region as a routing region, and thus a degree of freedom of a design, or the like, is reduced.

Conversely, in a case in which the first connection member 110 that may perform a redistribution function of the semiconductor chip is provided to a region encapsulating the semiconductor chip 120 before the semiconductor chip 120 is disposed, as in the fan-out semiconductor package 100A according to the exemplary embodiment, the number of layers of the second connection member 140 including the redistribution layer 142 formed after the semiconductor chip 120 is disposed may be reduced. Therefore, a problem in which the yield of the semiconductor chip 120 is decreased due to a process defect after the semiconductor chip 120 is disposed may be solved. Particularly, since the first connection member 110 includes the redistribution layers 112a and 112b, a wider routing region may be provided, such that the number of layers of the second connection member 140 may be sufficiently reduced. In addition, since rigidity of the fan-out semiconductor package 100A may be improved through the first connection member 110, warpage may be more easily controlled, and since the semiconductor chip 120 is disposed in the through-hole 110H of the first connection member 110, the semiconductor chip 120 may be more firmly fixed through wall-surface adhesion. Moreover, since the insulating layers 111a, 111b, and 111c of the first connection member 110 may be utilized as the routing region, a degree of design freedom may be improved.

The respective components included in the fan-out semiconductor package 100A according to the exemplary embodiment will hereinafter be described below in more detail.

The first connection member 110 may include the redistribution layers 112a, 112b, 112c redistributing the connection pads 122 of the semiconductor chip 120 to thus reduce the number of layers of the second connection member 140. If necessary, the first connection member 110 may maintain rigidity of the fan-out semiconductor package 100A depending on certain materials, and serve to secure uniformity of a thickness of the encapsulant 130. In addition, due to the first connection member 110, the fan-out semiconductor package 100A according to the exemplary embodiment may be used as a portion of a package-on-package. The first connection member 110 may have the through-hole 110H. The through-hole 110H may have the semiconductor chip 120 disposed therein to be spaced apart from the first connection member 110 by a predetermined distance. Side surfaces of the semiconductor chip 120 may be surrounded by the first connection member 110. However, such a form is only an example and may be variously modified into other forms, and the fan-out semiconductor package 100A may perform another function depending on such a form.

The first connection member 110 may include the first insulating layer 111a, the first redistribution layer 112a and the second redistribution layer 112b each disposed on one surface and the other surface of the first insulating layer 111a, the second insulating layer 111b disposed on the first insulating layer 111a and covering the first redistribution layer 112a, the third redistribution layer 112c disposed on the second insulating layer 111b, the third insulating layer 111c disposed on the first insulating layer 111a and covering the second redistribution layer 112b, and the fourth redistribution layer 112d disposed on the third insulating layer 111c. The first to fourth redistribution layers 112a, 112b, 112c, and 112d may be electrically connected to each other through the first to third vias 113a, 113b, and 113c respectively penetrating through the first to third insulating layers 111a, 111b, and 111c.

The first insulating layer 111a may maintain the rigidity of the fan-out semiconductor package 100A. For example, an insulating material may be used as a material of the first insulating layer 111a. In this case, the insulating material may be a thermosetting resin such as an epoxy resin, a thermoplastic resin such as a polyimide resin, a resin in which the thermosetting resin or the thermoplastic resin is impregnated together with an inorganic filler in a core material such as a glass cloth (or a glass fabric), for example, prepreg. Alternatively, a metal having excellent rigidity and thermal conductivity may be used as a material of the first insulating layer 111a. In this case, the metal may be an Fe—Ni based alloy. In this case, a Cu plating may also be formed on a surface of the Fe—Ni based alloy in order to secure adhesion between the Fe—Ni based alloy and the encapsulant, an interlayer insulating material, or the like. In addition to the materials as described above, glass, ceramic, plastic, or the like, may also be used as a material of the first insulating layer. A thickness t1 of the first insulating layer 111a may be designed depending on a thickness of the semiconductor chip 120. For example, a thickness of the first insulating layer 111a may be about 100 µm to 500 µm depending on a kind of semiconductor chip 120, but is not limited thereto.

The second insulating layer 111b and the third insulating layer 111c may be a kind of build-up layers for introducing the third redistribution layer 112c and the fourth redistribution layer 112d, and materials of the second insulating layer 111b and the third insulating layer 111c are not particularly limited as long as they are an insulating material. In this case, the insulating material may be a thermosetting resin such as an epoxy resin, a thermoplastic resin such as a polyimide resin, a resin having a reinforcement material such as an inorganic filler impregnated in the thermosetting resin or the thermoplastic resin, such as Ajinomoto Build up Film (ABF). Meanwhile, in a case in which a photosensitive insulating material such as a photoimagable dielectric (PID) resin is used as the materials of the second insulating layer 111b and the third insulating layer 111c, the second insulating layer 111b and the third insulating layer 111c may be formed at a more reduced thickness, and via holes may be formed by a photolithography method. Therefore, sizes of the vias may be reduced, and thus a fine pitch (for example, 30 µm or less) may be easily implemented. A thickness t2 of each of the second insulating layer 111b and the third insulating layer 111c is not particularly limited, but may be variously designed depending on design particulars. For example, a thickness of each of the second insulating layer 111b and the third insulating layer 111c except for each of the third redistribution layer 112c and the fourth redistribution layer 112d may be about 5 µm to 20 µm, and a thickness of each of the second insulating layer 111b and the third insulating layer 111c when considering a thickness of each of the third redistribution layer 112c and the fourth redistribution layer 112d may be about 15 µm to 70 µm, but is not limited thereto.

The first insulating layer 111a may be formed of an insulating material different from those of the second insulating layer 111b and the third insulating layer 111c. For example, the first insulating layer 111a may be formed of a material having excellent rigidity, and the second insulating layer 111b and the third insulating layer 111c may be formed of an ABF or PID material regardless of rigidity. As described above, materials appropriate for roles of the respective insulating layers 111a, 111b, and 111c may be selected and used. The first insulating layer 111a may have a modulus of elasticity greater than those of the second insulating layer 111b and the third insulating layer 111c. In addition, the thickness t1 of the first insulating layer 111a may be greater than the thickness t2 of each of the second insulating layer 111b and the third insulating layer 111c. It may be advantageous in maintaining the rigidity of the fan-out semiconductor package and fixing the semiconductor chip 120 that the first insulating layer 111a has a great thickness, and it may be advantageous in reducing a size of each of the second via 113b and the third via 113c and shortening an electrical path that each of the second insulating layer 111b and the third insulating layer 111c has a reduced thickness. However, the first to third insulating layers are not limited thereto.

The redistribution layers 112a, 112b, 112c, and 112d may serve to redistribute the connection pads 122 of the semiconductor chip 120. A material of each of the redistribution layers 112a, 112b, 112c, and 112d may be a conductive material such as copper (Cu), aluminum (Al), silver (Ag), tin (Sn), gold (Au), nickel (Ni), lead (Pb), titanium (Ti), or alloys thereof. The redistribution layers 112a, 112b, and 112c may perform various functions depending on designs of their corresponding layers. For example, each of the redistribution layers 112a, 112b, and 112c may include a ground (GND) pattern, a power (PWR) pattern, a signal (S) pattern, and the like. Here, the signal (S) pattern may include various signals except for the ground (GND) pattern, the power (PWR) pattern, and the like, such as data signals, and the like. In addition, each of the redistribution layers 112a, 112b, and 112c may also include a via pad, a connection terminal pad, or the like.

Thicknesses of the redistribution layers 112a, 112b, 112c, and 112d may be greater than that of the redistribution layer 142 of the second connection member 140. Since the first connection member 110 may have a thickness equal to or greater than that of the semiconductor chip 120, the redistribution layers 112a, 112b, 112c, and 112d may be formed at large sizes. On the other hand, the redistribution layer 142 of the second connection member 140 may be formed at a relatively smaller size for thinness. Each of the thicknesses of the redistribution layers 112a, 112b, 112c, and 112d may be, for example, about 10 µm to 50 µm, but is not limited thereto.

The first redistribution layer 112a may be disposed between the first insulating layer 111a and the second insulating layer 111b. The second redistribution layer 112b may be disposed between the first insulating layer 111a and the third insulating layer 111c. That is, the first redistribution layer 112a and the second redistribution layer 112b may be disposed on a level between the active surface and the inactive surface of the semiconductor chip 120. The first connection member 110 may be formed at a thickness corresponding to that of the semiconductor chip 120. Therefore, the first redistribution layer 112a and the second redistribution layer 112b formed in the first connection member 110 may be disposed on a level between the active surface and the inactive surface of the semiconductor chip 120. The third redistribution layer may be disposed on a level that is the same as that of the connection pad 122 or is substantially the same as that of the connection 122 when processing errors/margins are considered, and a lower surface of the third redistribution layer 112c may be disposed on a level below a lower surface of the connection pads 122 of the semiconductor chip 120. In addition, a distance between the redistribution layer 142 of the second connection member 140 and the third redistribution layer 112c may be smaller than that between the redistribution layer 142 of the second connection member 140 and the connection pads 122 of the semiconductor chip 120. Here, the third redistribution layer 112c may be disposed in a protruding form on the second insulating layer 111b, resulting in contacting the second connection member 140. Surface treatment layers (not illustrated) may further be formed on portions of patterns exposed from the fourth redistribution layer 112d through openings 131 formed in the encapsulant 130, if necessary. The surface treatment layers (not illustrated) are not particularly limited as long as they are known in the related art, and may be formed by, for example, electrolytic gold plating, electroless gold plating, organic solderability preservative (OSP) or electroless tinplating, electroless silver plating, electroless nickel plating/substituted gold plating, direct immersion gold (DIG) plating, hot air solder leveling (HASL), or the like.

The vias 113a, 113b, and 113c may electrically connect the redistribution layers 112a, 112b, 112c formed on different layers to each other, resulting in an electrical path in the first connection member 110. A conductive material such as copper (Cu), aluminum (Al), silver (Ag), tin (Sn), gold (Au), nickel (Ni), lead (Pd), or an alloy thereof, etc., may be used as materials of the vias 113a, 113b, and 113c. Each of the vias 113a, 113b, and 113c may be completely filled with the conductive material, or the conductive material may also be formed along a wall of each of the vias 113a, 113b, and 113c. Since first vias 113a penetrate through the first insulating layer 111a, the first vias 113a may have a diameter greater than those of second vias 113b and third vias 113c each penetrating through the second insulating layer 111b and the third insulating layer 111c. Since the first vias 113a penetrate through the first insulating layer 111a, the first vias 113a may be through-vias having a cylindrical shape or a sand-glass shape. Since the second vias 113b and the third vias 113c penetrate through the second insulating layer 111b and the third insulating layer 111c, respectively, the second vias 113b and the third vias 113c may be blind vias having a reverse tapered shape having a size increasing in a direction away from first insulating layer 111a. However, the first to third vias are not limited thereto.

The semiconductor chip 120 may be an integrated circuit (IC) provided in an amount of several hundreds to several millions of elements or more integrated in a single chip. The IC may be, for example, an application processor chip such as a central processor (for example, a CPU), a graphic processor (for example, a GPU), a digital signal processor, a cryptographic processor, a micro processor, a micro controller, or the like, but is not limited thereto. The semiconductor chip 120 may be formed on the basis of an active wafer. In this case, a base material of a body 121 may be silicon (Si), germanium (Ge), gallium arsenide (GaAs), or the like. Various circuits may be formed on the body 121. The connection pads 122 may electrically connect the semiconductor chip 120 to other components. A material of the connection pads 122 may be a conductive material such as aluminum (Al), or the like. A passivation layer 123 exposing the connection pads 122 may be formed on the body 121, and may be an oxide film, a nitride film, or the like, or a double layer of an oxide layer and a nitride layer. A lower surface of the connection pads 122 may have a step from a lower surface of the encapsulant 130 through the passivation layer 123. Resultantly, a phenomenon that the encapsulant 130 is bled to the lower surface of the connection pads 122 may be prevented to some degree. An insulating layer (not illustrated), and the like, may also be further disposed at other required positions.

The encapsulant 130 may protect the first connection member 110 and/or the semiconductor chip 120. An encapsulation form of the encapsulant 130 is not particularly limited, but may be a form in which the encapsulant 130 surrounds at least portions of the first connection member 110 and/or the semiconductor chip 120. For example, the encapsulant 130 may cover the first connection member 110 and the inactive surface of the semiconductor chip 120, and fill spaces between the walls of the through-hole 110H and the side surfaces of the semiconductor chip 120. In addition, the encapsulant 130 may also fill at least a portion of a space between the passivation layer 123 of the semiconductor chip 120 and the second connection member 140. Meanwhile, the encapsulant 130 may fill the through-hole 110H to thus serve as an adhesive and reduce buckling of the semiconductor chip 120 depending on certain materials.

The certain materials of the encapsulant 130 are not particularly limited. For example, an insulating material may be used as the certain materials of the encapsulant 130. In this case, the insulating material may be a thermosetting resin such as an epoxy resin, a thermoplastic resin such as a polyimide resin, a resin having a core material and/or an inorganic filler impregnated in the thermosetting resin or the thermoplastic resin, such as ABF, FR-4, Bismaleimide Triazine (BT), a PID resin, or the like. In addition, the known molding material such as an EMC, or the like, may also be used. Alternatively, a resin in which a thermosetting resin or a thermoplastic resin is impregnated together with an inorganic filler in a core material such as a glass cloth (or a glass fabric) may also be used as the insulating material.

The encapsulant 130 may have a modulus of elasticity lower than that of a material of the first insulating layer 111a of the first connection member 110. For example, a modulus of elasticity of the encapsulant 130 may be 15 GPa or less, such as about 50 MPa to 15 GPa. As the modulus of elasticity of the encapsulant 130 becomes relatively small, warpage of the fan-out semiconductor package 100A may be reduced through a buckling effect and a stress dispersing effect for the semiconductor chip 120. Since the encapsulant 130 fills the space of the through-hole 110H, the encapsulant 130 may have the buckling effect for the semiconductor chip 120, and since the encapsulant 130 covers the semiconductor chip 120, the encapsulant 130 may disperse and alleviate stress generated in the semiconductor chip 120. However, in a case in which the modulus of elasticity of the encapsulant 130 is excessively small, the encapsulant 130 may be excessively deformed, and thus the encapsulant 130 may not perform a basic role of the encapsulant. The modulus of elasticity is defined as a ratio between stress and deformation, and may be measured through a tension test specified in KS M 3001, KS M 527-3, ASTM D882, and the like.

The encapsulant 130 may include a plurality of layers formed of a plurality of materials. For example, a space within the through-hole 110H may be filled with a first encapsulant, and the first connection member 110 and the semiconductor chip 120 may be covered with a second encapsulant. Alternatively, the first connection member 110 and the semiconductor chip 120 may be covered at a predetermined thickness while the space within the through-hole 110H is filled with the first encapsulant, and the second encapsulant may be again coated on the first encapsulant at a predetermined thickness. In addition to the form described above, various forms may be used.

The encapsulant 130 may include conductive particles dispersed therein in order to block electromagnetic waves, if necessary. For example, the conductive particles may be any material that may block electromagnetic waves, for example, copper (Cu), aluminum (Al), silver (Ag), tin (Sn), gold (Au), nickel (Ni), lead (Pb), titanium (Ti), a solder, or the like. However, this is only an example, and the conductive particles are not particularly limited thereto.

The second connection member 140 may be configured to redistribute the connection pads 122 of the semiconductor chip 120. Several ten to several hundred connection pads 122 having various functions may be redistributed by the second connection member 140, and may be physically or electrically connected to an external source through the connection terminals 170 depending on the functions. The second connection member 140 may include an insulating layer 141, the redistribution layers 142 disposed on the insulating layer 141, and vias 143 penetrating through the insulating layer 141 and connecting the redistribution layers 142 to each other. The second connection member 140 may include a plurality of layers unlike the drawing depending on designs of the redistribution layers.

An insulating material may be used as a material of the insulating layer 141. In this case, a photosensitive insulating material such as a photoimagable dielectric (PID) resin may also be used as the insulating material. In this case, the insulating layer 141 may be formed to have a smaller thickness, and a fine pitch of the via 143 may be achieved more easily. In a case in which the insulating layer 141 includes a plurality of layers, materials of the respective layers may be the same as each other, and may also be different from each other, if necessary. In the case in which the insulating layer 141 includes the plurality of layers, the respective layers may be integrated with each other depending on processes, so that boundaries therebetween may not be readily apparent. However, the insulating layer 141 is not limited thereto.

The redistribution layers 142 may substantially serve to redistribute the connection pads 122. A material of each of the redistribution layers 142 may be a conductive material such as copper (Cu), aluminum (Al), silver (Ag), tin (Sn), gold (Au), nickel (Ni), lead (Pb), titanium (Ti), or alloys thereof. The redistribution layers 142 may perform various functions depending on designs of their corresponding layers. For example, each of the redistribution layers 142 may include a ground (GND) pattern, a power (PWR) pattern, a signal (S) pattern, and the like. Here, the signal (S) pattern may include various signals except for the ground (GND) pattern, the power (PWR) pattern, and the like, such as data signals, and the like. In addition, each of the redistribution layers 142 may include a via pad, a connection terminal pad, and the like.

Surface treatment layers (not illustrated) may further be formed on portions of patterns exposed from the redistribution layers 142, if necessary. The surface treatment layers (not illustrated) are not particularly limited as long as they are known in the related art, and may be formed by, for example, electrolytic gold plating, electroless gold plating, OSP or electroless tin plating, electroless silver plating, electroless nickel plating/substituted gold plating, DIG plating, HASL, or the like, as described above.

The vias 143 may electrically connect the redistribution layers 142, the connection pads 122, or the like, formed on different layers to each other, resulting in an electrical path in the fan-out semiconductor package 100A. A material of each of the vias 143 may be a conductive material such as copper (Cu), aluminum (Al), silver (Ag), tin (Sn), gold (Au), nickel (Ni), lead (Pb), titanium (Ti), or alloys thereof. The via 143 may be completely filled with the conductive material, or the conductive material may also be formed along a wall of the via. In addition, the via 143 may have all of the shapes known in the related art, such as a tapered shape, a cylindrical shape, and the like.

The second connection member 140 may connect the first connection member 110 and the semiconductor chip 120 to each other. Here, the meaning that the first connection member 110 and the semiconductor chip 120 are connected to each other by the second connection member 140 is that the first connection member 110 and the semiconductor chip 120 are spaced apart from each other, but the second connection member 140 is connected to both of the first connection member 110 and the semiconductor chip 120, and thus the first connection member 110 and the semiconductor chip 120 are connected to each other through the second connection member 140. That is, the first connection member 110 may be electrically connected to the semiconductor chip 120 by a bypass provided by the second connection member 140, and the second connection member 140 may be directly electrically connected to the semiconductor chip 120.

The passivation layer 150 may be configured to protect the second connection member 140 from external physical or chemical damage. The passivation layer 150 may have the openings 151 exposing at least portions of one 142b of redistribution layers 142a, 142b, and 142c of the second connection member 140. Each of the openings 151 may expose the entirety or only a portion of a surface of the redistribution layer 142b. A material of the passivation layer 150 is not particularly limited, and may be a photosensitive insulating material such as a photoimagable dielectric (PID) resin. Alternatively, a solder resist may also be used as the material of the passivation layer 150. Alternatively, an insulating resin that does not include a core material, but includes a filler, for example, an ABF including an inorganic filler and an epoxy resin, or the like, may be used as the material of the passivation layer 150.

The underbump metal layer 160 may be additionally configured to improve connection reliability of the connection terminals 170 to improve board level reliability. The underbump metal layer 160 may be disposed on walls in the openings 151 of the passivation layer 150 and the exposed redistribution layer 142b of the second connection member 140. The underbump metal layer 160 may be formed by the known metallization method using the known conductive material such as a metal.

The connection terminals 170 may be additionally configured to physically or electrically externally connect the fan-out semiconductor package 100A. For example, the fan-out semiconductor package 100A may be mounted on the main board of the electronic device through the connection terminals 170. Each of the connection terminals 170 may be formed of a conductive material, for example, a solder, or the like. However, this is only an example, and a material of each of the connection terminals 170 is not particularly limited thereto. Each of the connection terminals 170 may be a land, a ball, a pin, or the like. The connection terminals 170 may be formed of multiple layers or a single layer. When the connection terminals 170 are formed of the multiple layers, the connection terminals 170 may include a copper pillar and a solder. When the connection terminals 170 are formed of the single layer, the connection terminals 170 may include a tin-silver solder or copper. However, this is only an example, and the connection terminals 170 are not limited thereto. The number, an interval, a disposition, or the like, of the connection terminals 170 is not particularly limited, and may be sufficiently modified by a person skilled in the art depending on design particulars. For example, the connection terminals 170 may be provided in an amount of several tens to several thousands according to the number of connection pads 122 of the semiconductor chip 120, but are not limited thereto, and may also be provided in an amount of tens of thousands or more.

At least one of the connection terminals 170 may be disposed in a fan-out region. The fan-out region is a region except for the region in which the semiconductor chip 120 is disposed. That is, the fan-out semiconductor package 100A according to the exemplary embodiment may be a fan-out package. The fan-out package may have excellent reliability as compared to a fan-in package, may allow for a plurality of input/output (I/O) terminals to be implemented, and may facilitate a 3D interconnection. In addition, as compared to a ball grid array (BGA) package, a land grid array (LGA) package, or the like, the fan-out package may be mounted on an electronic device without a separate board. Thus, the fan-out package may be manufactured to have a small thickness, and may have price competitiveness.

FIGS. 12A through 12D are schematic views illustrating a process of manufacturing the fan-out semiconductor package of FIG. 9.

Figure 12A:
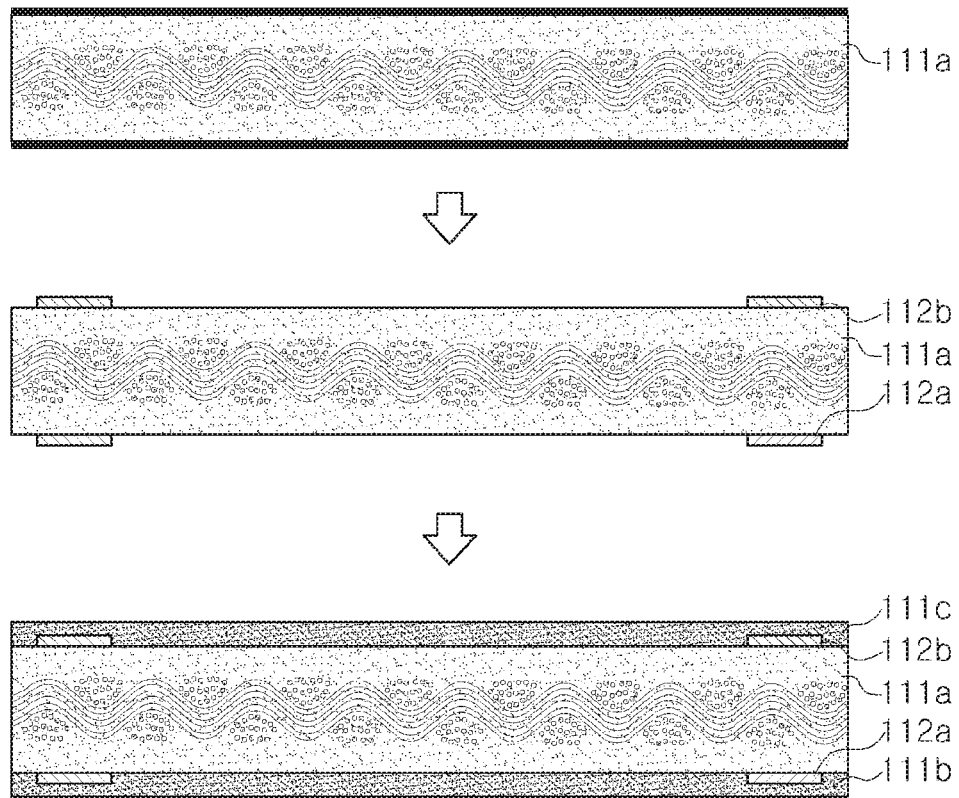
FIGS. 12A through 12D are schematic views illustrating a process of manufacturing the fan-out semiconductor package of FIG. 9.

Referring to FIG. 12A, the first insulating layer 111a may be prepared. The first insulating layer 111a may be manufactured and utilized at various sizes in order to facilitate mass production. That is, after the first insulating layer 111a having a large size is prepared, a plurality of fan-out semiconductor packages 100A may be manufactured through a process to be described below. Then, the plurality of fan-out semiconductor packages 100A may be singulated into individual unit packages through a cutting process. A fiducial mark for improved pick-and-place (P&P) performance may be present in the first insulating layer 111a, if necessary. Since a position at which the semiconductor chip 120 is mounted may be more clearly recognized through the fiducial mark, completeness of manufacturing may be improved. Thin metal layers such as copper clad laminates (CCLs), or the like, may be formed on upper and lower surfaces of the first insulating layer 111a, and may serve as basic seed layers for forming redistribution layers, and the like.

Next, the first redistribution layer 112a and the second redistribution layer 112b may be formed on both surfaces of the first insulating layer 111a, respectively. The first redistribution layer 112a and the second redistribution layer 112b may be formed by the known method. For example, the first redistribution layer 112a and the second redistribution layer 112b may be formed by electroplating, electroless plating, or the like, using a dry film pattern. In more detail, the first redistribution layer 112a and the second redistribution layer 112b may be formed using a method such as chemical vapor deposition (CVD), physical vapor deposition (PVD), sputtering, a subtractive process, an additive process, a semi-additive process (SAP), a modified semi-additive process (MSAP), or the like, but are not limited thereto. When the first redistribution layer 112a and the second redistribution layer 112b are formed, via holes penetrating through the first insulating layer 111a may be formed using a mechanical drilling process and/or a laser drilling process, and the first vias 113a connecting the first redistribution layer 112a and the second redistribution layer 112b to each other may be formed by plating, or the like. In a case in which the via holes are formed using the mechanical drilling process and/or the laser drilling process, a desmearing process may be performed on the via holes to remove resin smear in the via holes. The desmearing process may be performed using, for example, a permanganate method, but is not limited thereto.

Next, the second insulating layer 111b and the third insulating layer 111c each covering the first redistribution layer 112a and the second redistribution layer 112b may be formed on both surfaces of the first insulating layer 111a, respectively. The second insulating layer 111b and the third insulating layer 111c may be formed by a method of laminating precursors of the second insulating layer 111b and the third insulating layer 111c on both surfaces of the first insulating layer 111a, respectively, and then hardening the precursors, a method of applying materials for forming the second insulating layer 111b and the third insulating layer 111c onto both surfaces of the first insulating layer 111a and then hardening the materials, or the like, but are not limited thereto. As the method of laminating the precursors, for example, a method of performing a hot press process of pressing the precursors for a predetermined time at a high temperature, decompressing the precursors, and then cooling the precursors to room temperature, cooling the precursors in a cold press process, and then separating a work tool, or the like, may be used. As the method of applying the materials, for example, a screen printing method of applying ink with a squeegee, a spray printing method of applying ink in a mist form, or the like, may be used. The hardening process, a post-process, may be a process of drying the materials so as to not be completely hardened in order to use a photolithography method, or the like.

Figure 12B:
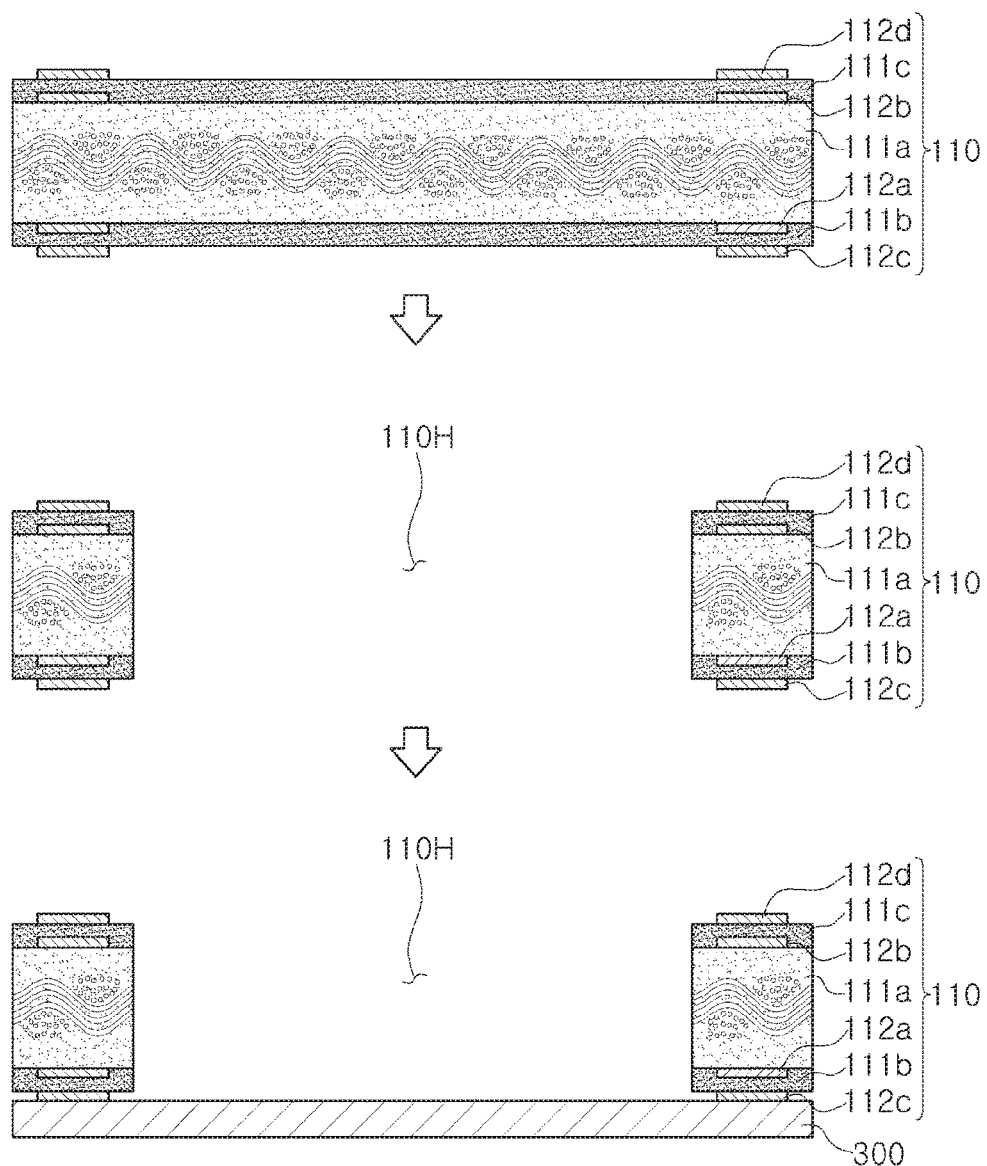

Referring to FIG. 12B, the third redistribution layer 112c and the fourth redistribution layer 112d may be formed on the second insulating layer 111b and the third insulating layer 111c, respectively. The third redistribution layer 112c and the fourth redistribution layer 112d may be formed by the known method. For example, the third redistribution layer 112c and the fourth redistribution layer 112d may be formed by electroplating, electroless plating, or the like, using a dry film pattern. In more detail, the third redistribution layer 112c and the fourth redistribution layer 112d may be formed using a method such as chemical vapor deposition (CVD), physical vapor deposition (PVD), sputtering, a subtractive process, an additive process, a semi-additive process (SAP), a modified semi-additive process (MSAP), or the like, but are not limited thereto. When the third redistribution layer 112c and the fourth redistribution layer 112d are formed, via holes each penetrating through the second insulating layer 111b and the third insulating layer 111c may be formed using a mechanical drilling process and/or a laser drilling process, and the second vias 113b and the third vias 113c may be formed by plating, or the like. In a case in which the second insulating layer 111b and the third insulating layer 111c include a photosensitive insulating material, the via holes may be formed by a photolithography method.

Next, the through-hole 110H penetrating through the first insulating layer 111a, the second insulating layer 111b, and the third insulating layer 111c may be formed. A method of forming the through-hole 110H is also not particularly limited. The through-hole 110H may be formed by, for example, a mechanical drilling process and/or a laser drilling process, a sand blasting method using particles for polishing, a dry etching method using plasma, or the like. In a case in which the through-hole 110H is formed using the mechanical drilling process and/or the laser drilling process, a desmearing process such as a permanganate method, or the like, may be performed to remove resin smear in the through-hole 110H. A size, a shape, or the like, of the through-hole 110H may be designed depending on a size, a shape, the number, or the like, of semiconductor chips 120 to be mounted. The first connection member 110 having the through-hole 110H may be formed through a series of processes.

Next, the first connection member 110 may be attached to a temporary film 300. Any material that may fix the first connection member 110 may be used as the temporary film 300. As a non-restrictive example of this material, an adhesive film such as tape, or the like, may be used. An example of the tape may include a thermosetting adhesive tape of which adhesion is weakened by heat treatment, an ultraviolet-curable adhesive tape of which adhesion is weakened by ultraviolet ray irradiation, or the like.

Figure 12C:
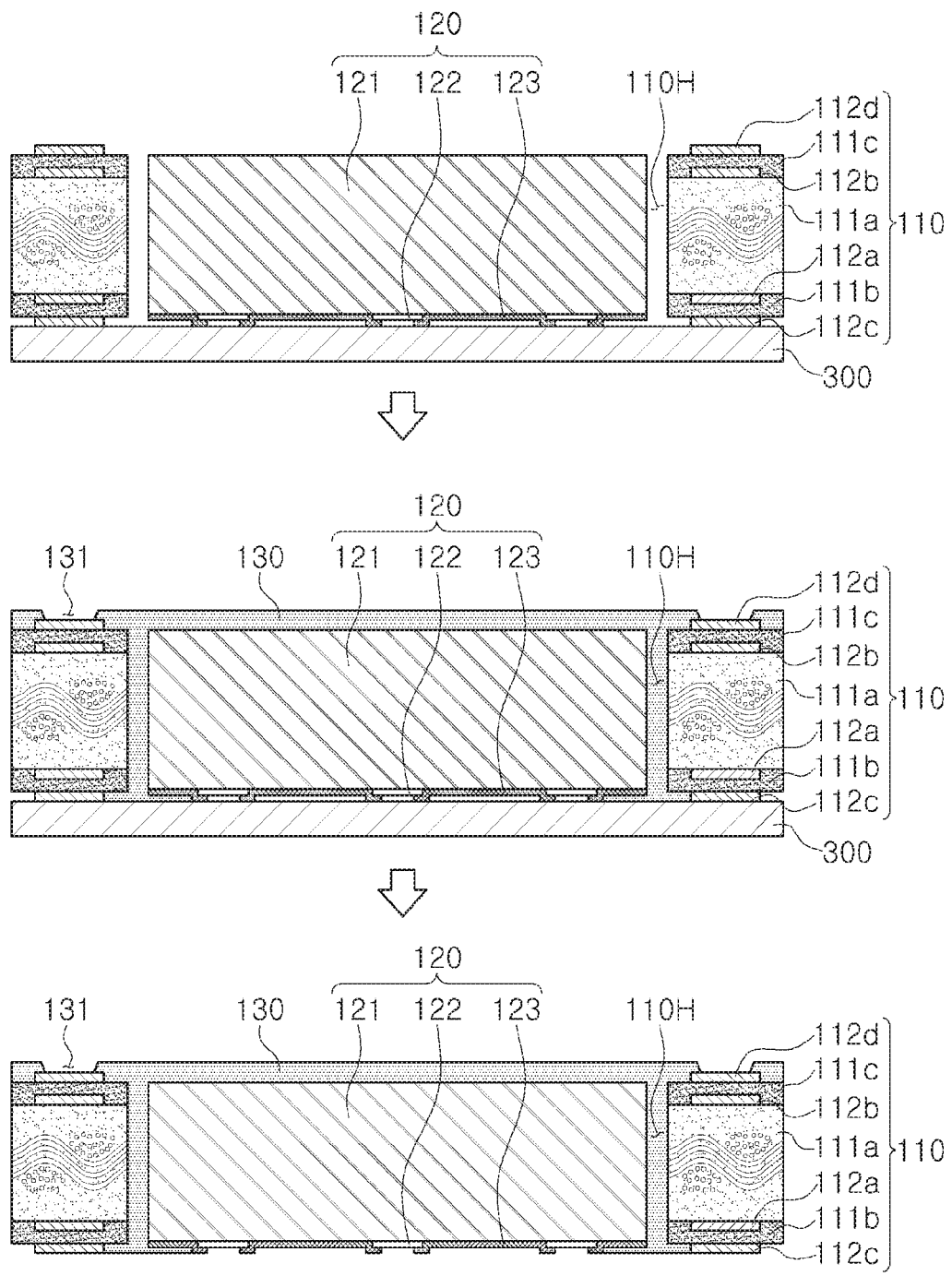

Referring to FIG. 12C, the semiconductor chip 120 may be disposed in the through-hole 110H. In detail, the semiconductor chip 120 may be attached to and disposed on the temporary film 300 exposed through the through-hole 110H of the first connection member 110. The semiconductor chip 120 may be disposed in a face-down form so that the connection pads 122 are attached to the temporary film 300.

Next, the semiconductor chip 120 may be encapsulated using the encapsulant 130. The encapsulant 130 may cover the first connection member 110 and the semiconductor chip 120, and may fill the space within the through-hole 110H. The encapsulant 130 may be formed by a known method. For example, the encapsulant 130 may be formed by a method of laminating a precursor of the encapsulant 130 and then hardening the precursor. Alternatively, the encapsulant 130 may be formed by a method of applying a pre-encapsulant onto the temporary film 300 so as to encapsulate the semiconductor chip 120 and then hardening the pre-encapsulant. The semiconductor chip 120 may be fixed by the hardening. As the method of laminating the precursor, for example, a method of performing a hot press process of pressing the precursor for a predetermined time at a high temperature, decompressing the precursor, and then cooling the precursor to room temperature, cooling the precursor in a cold press process, and then separating a work tool, or the like, may be used. As the method of applying the pre-encapsulant, for example, a screen printing method of applying ink with a squeegee, a spray printing method of applying ink in a mist form, or the like, may be used. Openings 131 exposing at least portions of the fourth redistribution layer 112d may be formed in the encapsulant 130, if necessary.

Next, the temporary film 300 may be peeled off. A method of peeling off the temporary film 300 is not particularly limited, but may be the known method. For example, in a case in which thermosetting adhesive tape of which adhesion is weakened by heat treatment, ultraviolet-curable adhesive tape of which adhesion is weakened by ultraviolet ray irradiation, or the like, is used as the temporary film 300, the temporary film 300 may be peeled off after the adhesion of the temporary film 300 is weakened by heat-treating the temporary film 300 or may be peeled off after the adhesion of the temporary film 300 is weakened by irradiating the temporary film 300 with an ultraviolet ray.

Figure 12D:
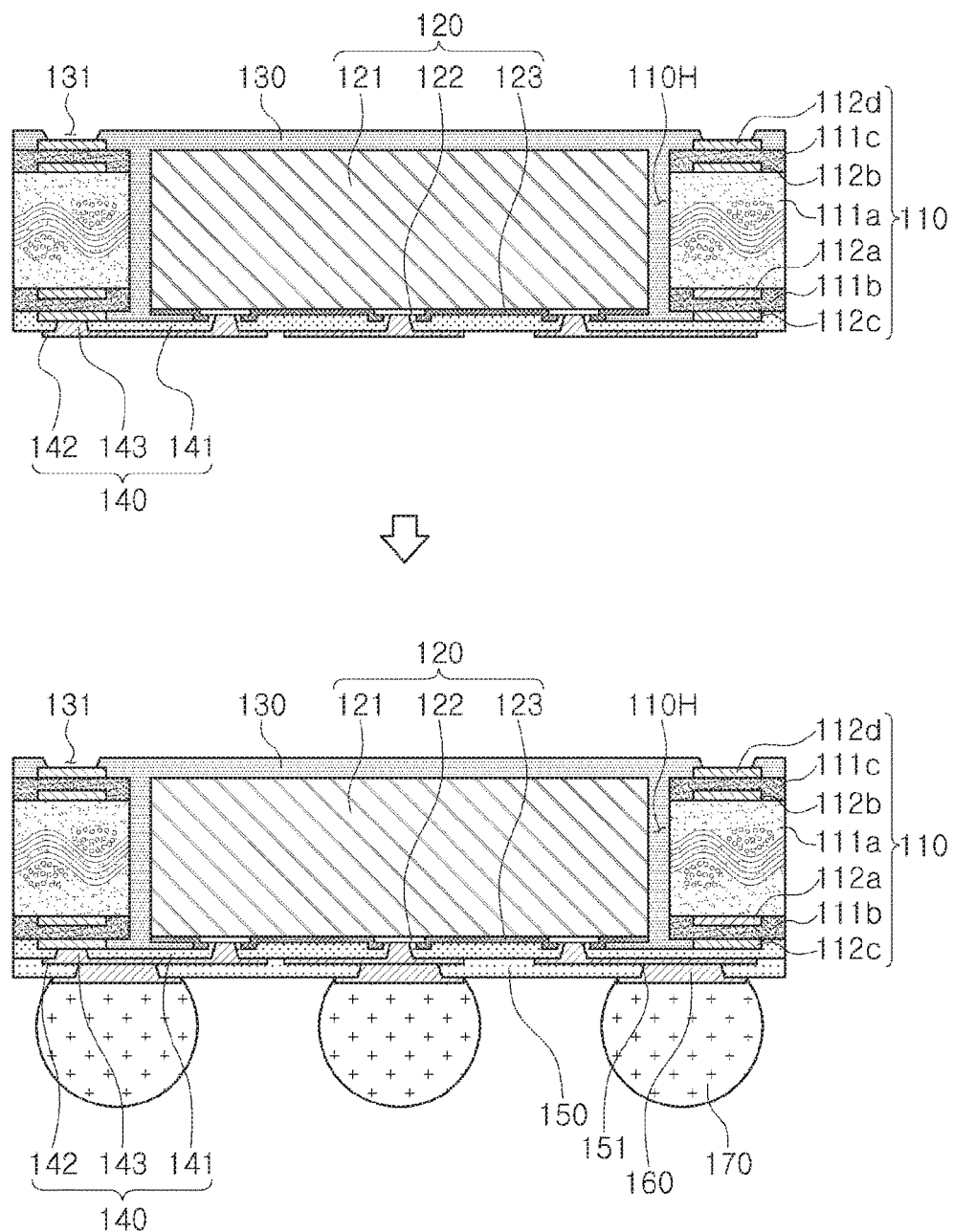

Referring to FIG. 12D, the second connection member 140 may be formed on the first connection member 110 and the active surface of the semiconductor chip 120 from which the temporary film 300 is peeled off. The second connection member 140 may be formed by a method of forming the insulating layer 141 and forming the redistribution layers 142 and the vias 143. The insulating layer 141 may be formed by a method of laminating a precursor of the insulating layer 141 on the first connection member 110 and the active surface of the semiconductor chip 120 and then hardening the precursor, or the like, but is not limited thereto. As the method of laminating the precursor, for example, a method of performing a hot press process of pressing the precursor for a predetermined time at a high temperature, decompressing the precursor, and then cooling the precursor to room temperature, cooling the precursor in a cold press process, and then separating a work tool, or the like, may be used. The hardening process, a post-process, may be a process of drying the material so as to not be completely hardened in order to use a photolithography method, or the like. The vias 143 may be formed by forming via holes using a photolithography method and then performing plating. The redistribution layers 142 may also be formed by plating. For example, the redistribution layers 142 may be formed by electroplating, electroless plating, or the like, using a dry film pattern. In more detail, the redistribution layers 142 may be formed using a method such as chemical vapor deposition (CVD), physical vapor deposition (PVD), sputtering, a subtractive process, an additive process, a semi-additive process (SAP), a modified semi-additive process (MSAP), or the like.

Next, the passivation layer 150 may be formed on the second connection member 140. The passivation layer 150 may also be formed by a method of laminating a precursor of the passivation layer 150 and then hardening the precursor, a method of applying a material for forming the passivation layer 150 and then hardening the material, or the like. As the method of laminating the precursor, for example, a method of performing a hot press process of pressing the precursor for a predetermined time at a high temperature, decompressing the precursor, and then cooling the precursor to room temperature, cooling the precursor in a cold press process, and then separating a work tool, or the like, may be used. As the method of applying the pre-encapsulant, for example, a screen printing method of applying ink with a squeegee, a spray printing method of applying ink in a mist form, or the like, may be used. The hardening process, a post-process, may be a process of drying the material so as to not be completely hardened in order to use a photolithography method, or the like.

The openings 151 may be formed in the passivation layer 150 so that at least portions of the redistribution layer 142 are exposed. The openings 151 may be formed using a mechanical drilling process and/or a laser drilling process. Alternatively, the openings 151 may be formed by a photolithography method. In a case in which the openings 151 are formed using the mechanical drilling process and/or the laser drilling process, a desmearing process may be performed on the openings 151 using a permanganate method, or the like, to remove resin smear. The underbump metal layer 160 may be formed in the openings 151 by the known metallization method. In addition, the connection terminals 170 may be formed on the underbump metal layer 160. The connection terminals 170 may be fixed by reflow, and portions of the connection terminals 170 may be embedded in the passivation layer 150 in order to enhance fixing force, and the remaining portions of the connection terminals 170 may be exposed externally, whereby reliability may be improved.

Figure 13:
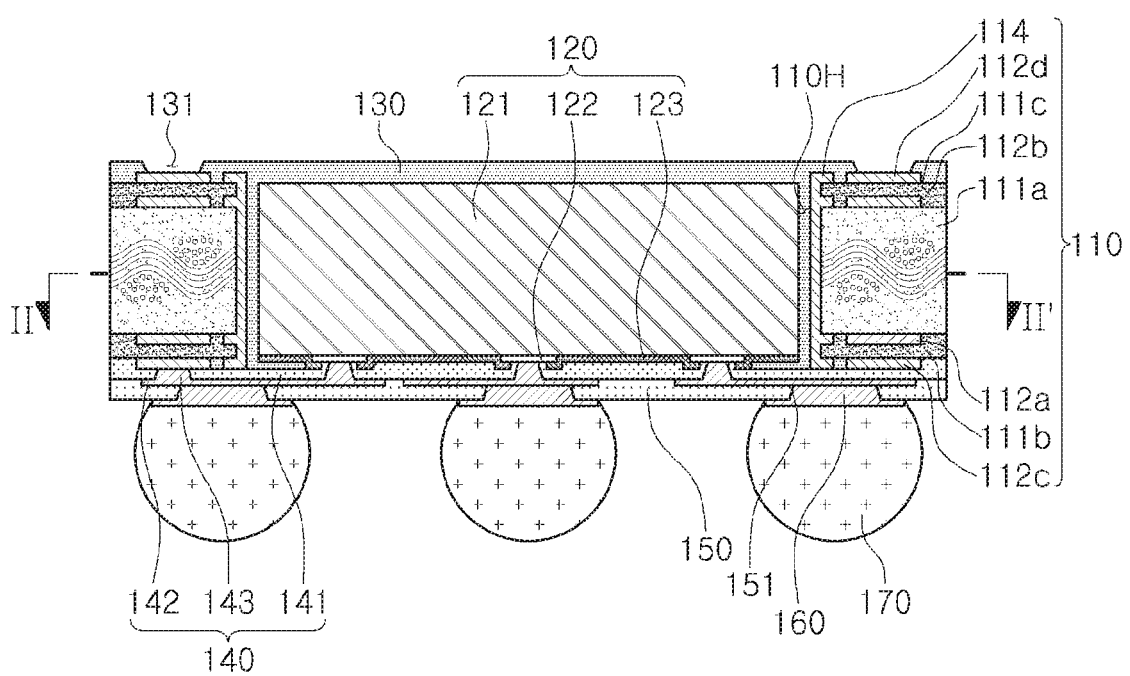
FIG. 13 is a schematic cross-sectional view illustrating another example of a fan-out semiconductor package.

FIG. 13 is a schematic cross-sectional view illustrating another example of a fan-out semiconductor package.

Figure 14:
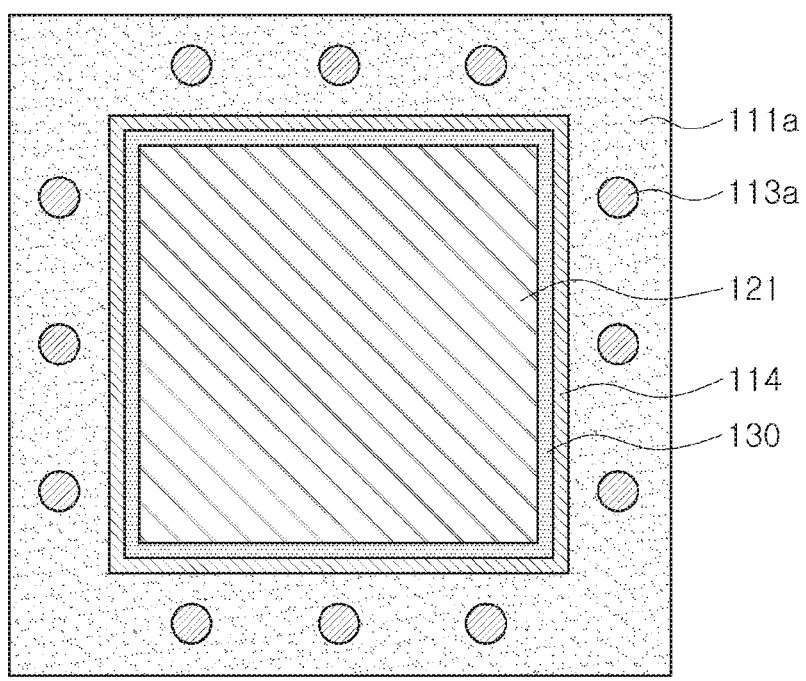
FIG. 14 is a schematic plan view taken along line II-II' of the fan-out semiconductor package of FIG. 13.

FIG. 14 is a schematic plan view taken along line II-II' of the fan-out semiconductor package of FIG. 13.

Referring to the drawings, in a fan-out semiconductor package 100B according to another exemplary embodiment in the present disclosure, a metal layer 114 may be disposed on a wall of a through-hole 100H of a first connection member 110. The metal layer 114 may serve to effectively disperse heat generated in the semiconductor chip 120. In addition, the metal layer 114 may serve to block an electromagnetic wave. In addition, the metal layer 114 may be connected to a ground pattern of at least one of other redistribution layers 112a, 112b, 112c, and 112d of the first connection member 110 to thereby be utilized as a ground. The metal layer 114 may be disposed over the entirety of the wall or may be patterned and disposed at a certain shape. The metal layer 114 may include the conductive material as described above, that is, a metal material. A description, or the like, of other configurations and a manufacturing method except for the abovementioned configuration overlaps that described above, and is thus omitted.

Figure 15:
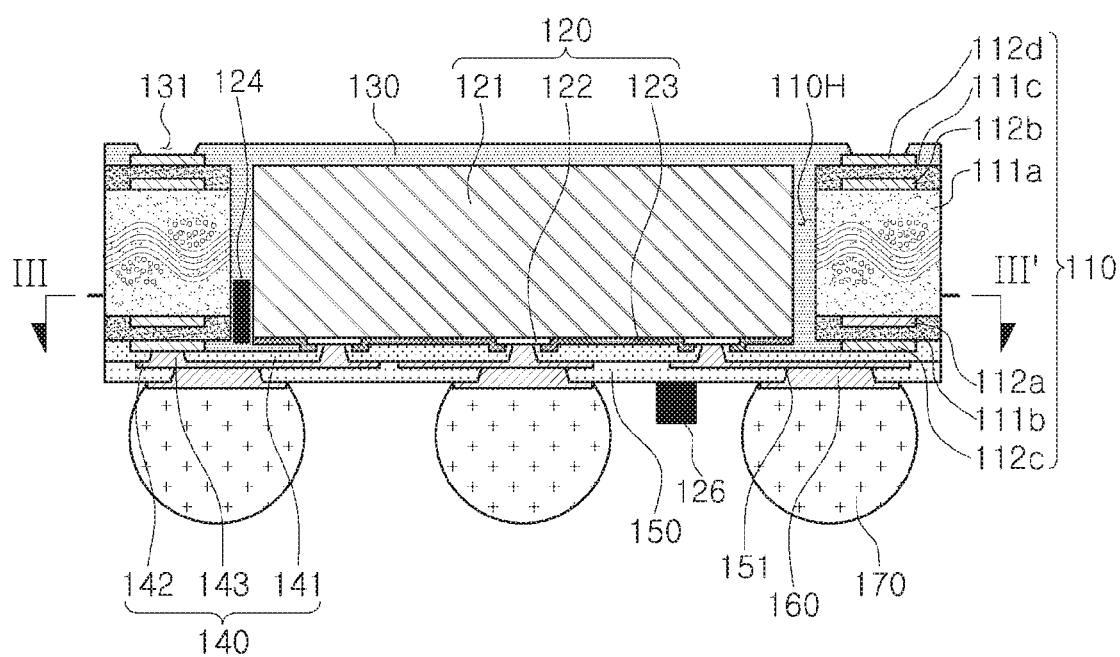
FIG. 15 is a schematic cross-sectional view illustrating another example of a fan-out semiconductor package.

FIG. 15 is a schematic cross-sectional view illustrating another example of a fan-out semiconductor package.

Figure 16:
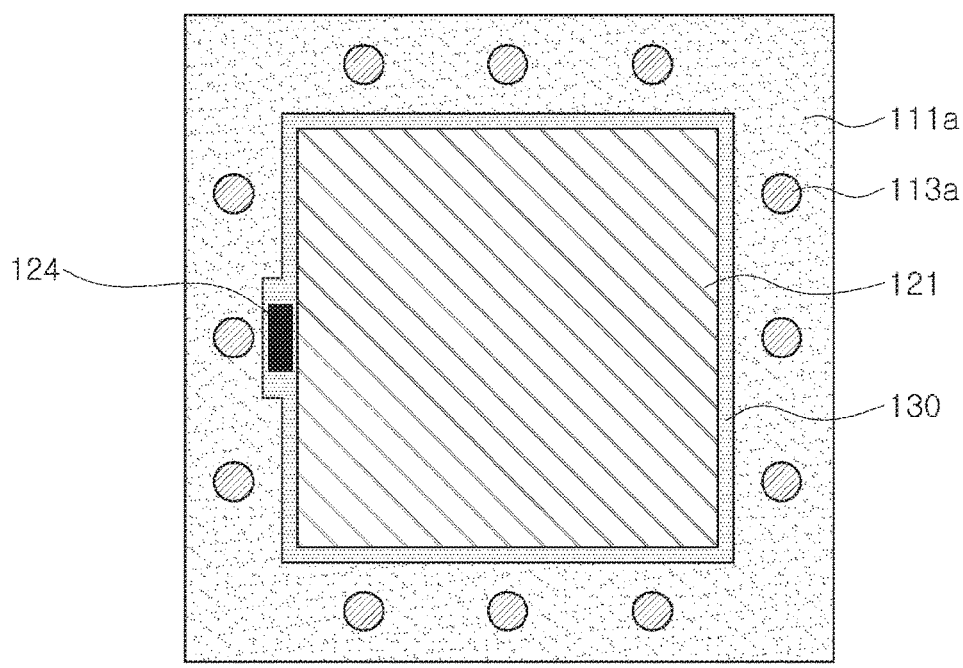
FIG. 16 is a schematic plan view taken along line III-III' of the fan-out semiconductor package of FIG. 15.

FIG. 16 is a schematic plan view taken along line of the fan-out semiconductor package of FIG. 15.

Referring to the drawings, in a fan-out semiconductor package 100C according to another exemplary embodiment in the present disclosure, a separate first passive component 124 may be disposed in a through-hole 110H. In addition, a separate second passive component 126 may be disposed on a surface of a passivation layer 150. The first passive component 124 may be a high capacitance capacitor such as a multilayer ceramic capacitor (MLCC), but is not limited thereto. The second passive component 126 may be a low capacitance capacitor such as an Si-based capacitor, but is not limited thereto. The first passive component 124 and the second passive component 126 may be commonly connected to a power line, and may be electrically connected to a semiconductor chip 120 through the power line to improve power supply efficiency. A description, or the like, of other configurations and a manufacturing method except for the abovementioned configuration overlaps that described above, and is thus omitted.

Figure 17:
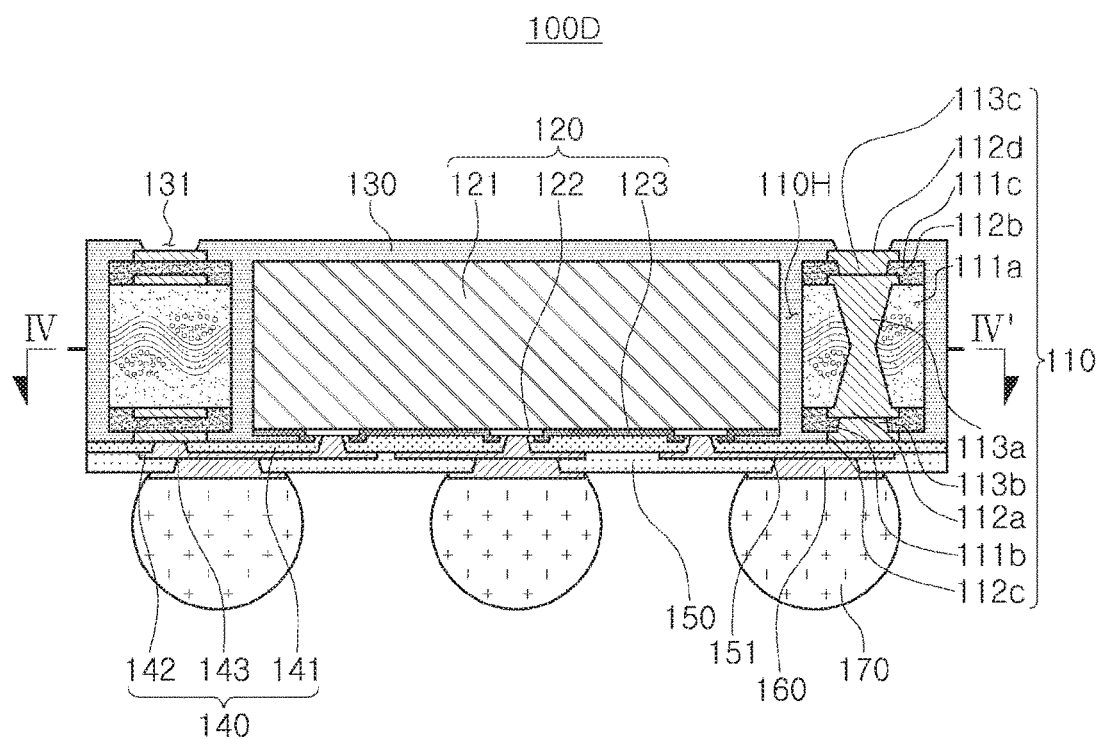
FIG. 17 is a schematic cross-sectional view illustrating another example of a fan-out semiconductor package.

FIG. 17 is a schematic cross-sectional view illustrating another example of a fan-out semiconductor package.

Figure 18:
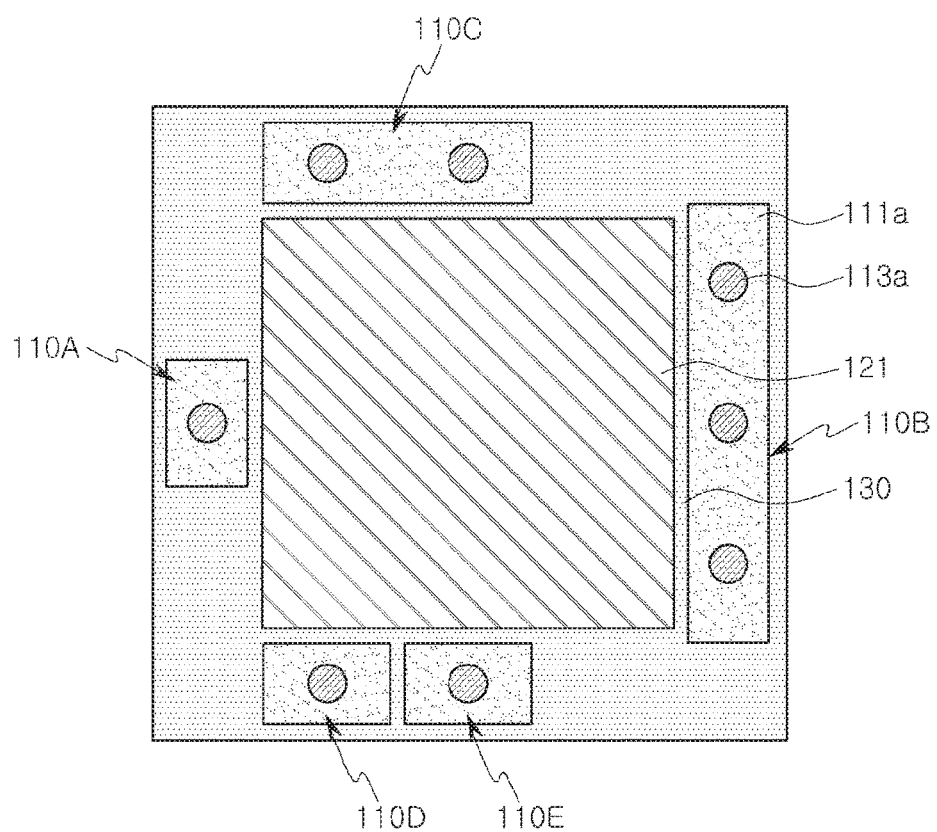
FIG. 18 is a schematic plan view taken along line IV-IV' of the fan-out semiconductor package of FIG. 17.

FIG. 18 is a schematic plan view taken along line IV-IV' of the fan-out semiconductor package of FIG. 17.

Referring to the drawings, in a fan-out semiconductor package 100D according to another exemplary embodiment in the present disclosure, a first connection member 110 may include one or more connection units 110A to 110E. The respective connection units 110A to 110E may be disposed adjacently to a semiconductor chip 120 and spaced apart from each other. Each of the connection units 110A to 110E may include a first insulating layer 111a, a first redistribution layer 112a and a second redistribution layer 112b disposed on both surfaces of the first insulating layer 111a, respectively, a second insulating layer 111b disposed on the first insulating layer 111a and covering the first redistribution layer 112a, a third redistribution layer 112c disposed on the second insulating layer 111b, a third insulating layer 111c disposed on the first insulating layer 111a and covering the second redistribution layer 112b, and a fourth redistribution layer 112d disposed on the third insulating layer 111c. The first to fourth redistribution layers 112a, 112b, 112c, and 112d of each of the connection units 110A to 110E may be electrically connected to connection pads 122. An encapsulant 130 may encapsulate at least portions of the respective connection units 110A to 110E and an inactive surface of the semiconductor chip 120. The encapsulant 130 may encapsulate the entirety of side surfaces of the respective connection units 110A to 110E. Resultantly, the side surfaces of the respective connection units 110A to 110E may not be exposed externally. A description, or the like, of other configurations and a manufacturing method except for the abovementioned configuration overlaps that described above, and is thus omitted.

Figure 19:
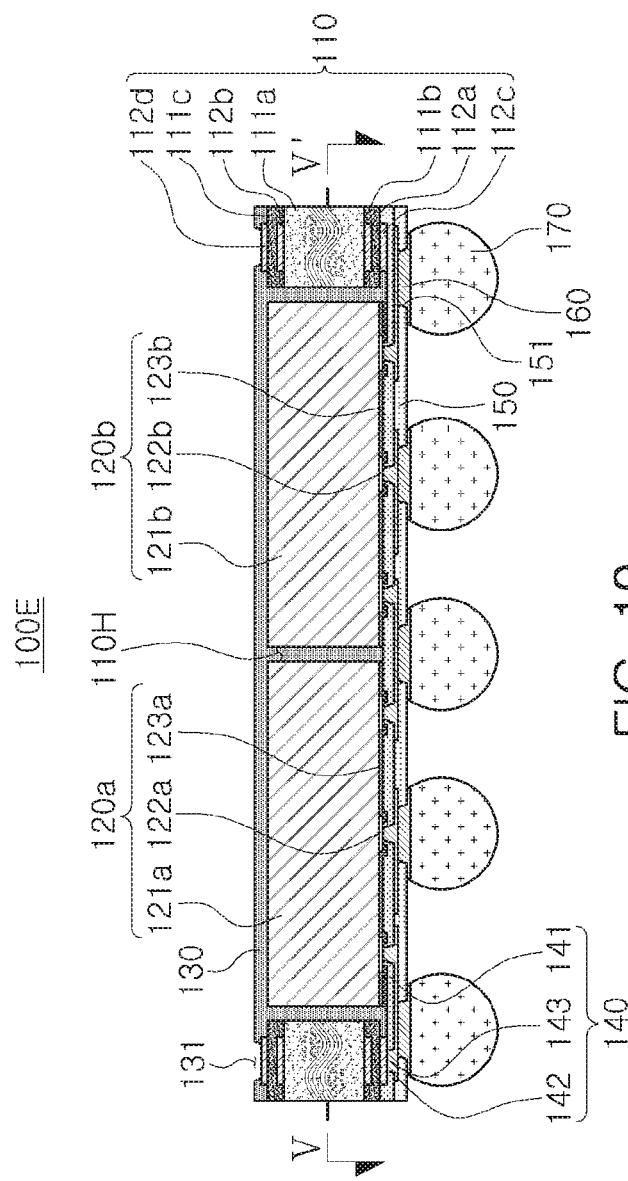
FIG. 19 is a schematic cross-sectional view illustrating another example of a fan-out semiconductor package.

FIG. 19 is a schematic cross-sectional view illustrating another example of a fan-out semiconductor package.

Figure 20:
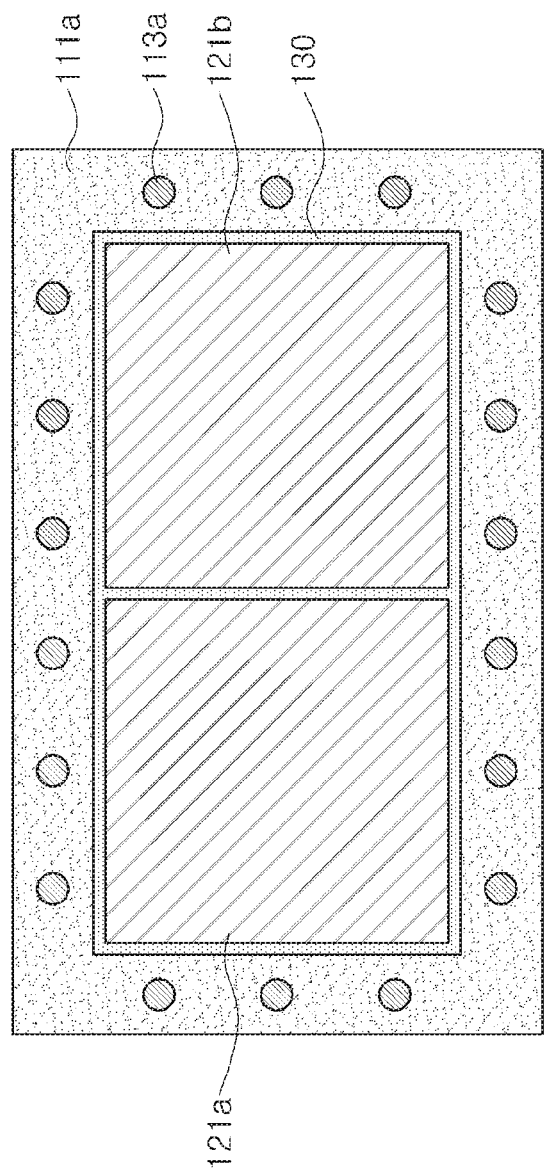
FIG. 20 is a schematic plan view taken along line V-V' of the fan-out semiconductor package of FIG. 19.

FIG. 20 is a schematic plan view taken along line V-V' of the fan-out semiconductor package of FIG. 19.

Referring to the drawings, a fan-out semiconductor package 100E according to another exemplary embodiment in the present disclosure may include a plurality of semiconductor chips 120a and 120b. The plurality of semiconductor chips 120a and 120b may be disposed together with each other in a through-hole 110H. The plurality of semiconductor chips 120a and 120b may be integrated circuits (ICs) the same as each other or may be ICs different from each other. An encapsulant 130 may cover a first connection member 110 and inactive surfaces of the plurality of semiconductor chips 120a and 120b, and fill spaces between walls of the through-hole 110H and side surfaces of the plurality of semiconductor chips 120a and 120b. The plurality of semiconductor chips 120a and 120b may include bodies 121a and 121b, connection pads 122a and 122b, and passivation layers 123a and 123b, respectively. The respective connection pads 122a and 122b may be redistributed through the first connection member 110 and a second connection member 140. A description, or the like, of other configurations and a manufacturing method except for the abovementioned configuration overlaps that described above, and is thus omitted.

Figure 21:
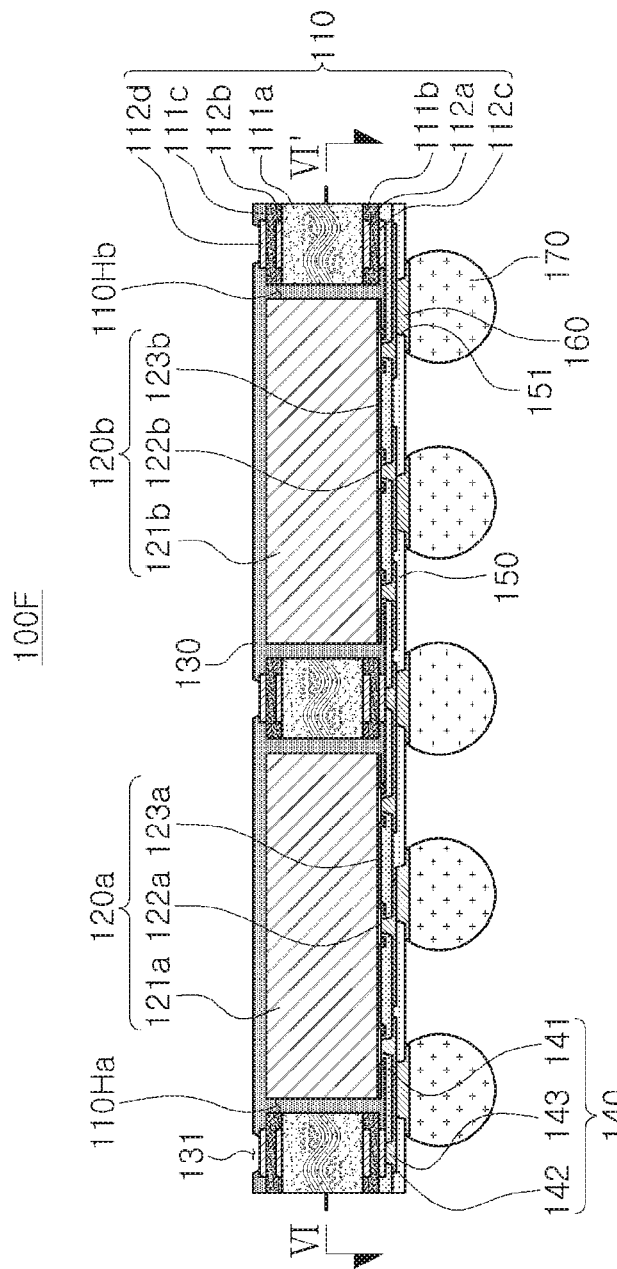
FIG. 21 is a schematic cross-sectional view illustrating another example of a fan-out semiconductor package.

FIG. 21 is a schematic cross-sectional view illustrating another example of a fan-out semiconductor package.

Figure 22:
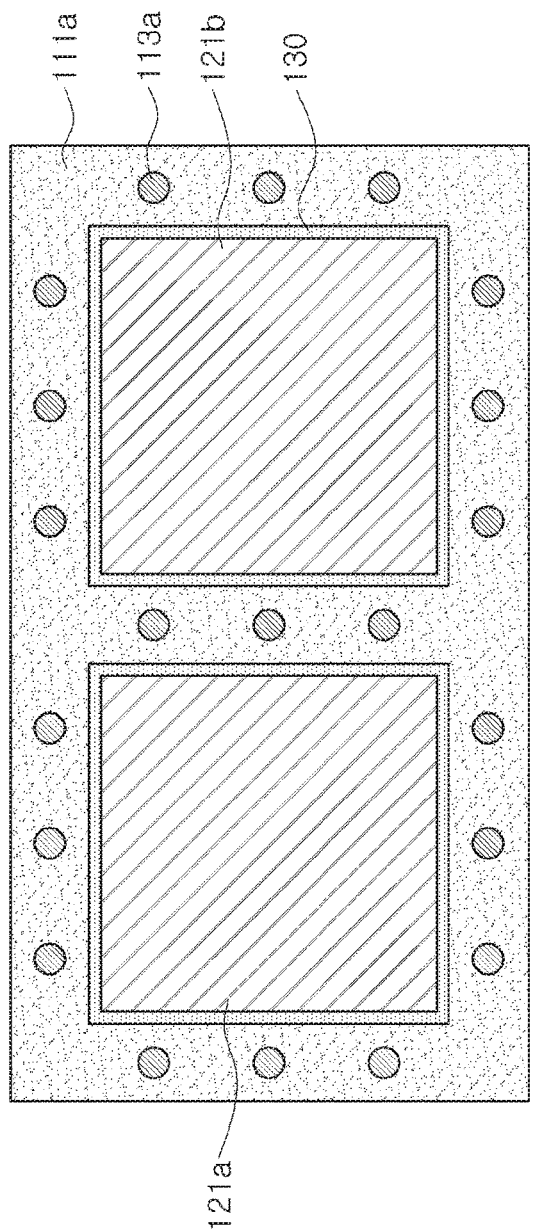
FIG. 22 is a schematic plan view taken along line VI-VI' of the fan-out semiconductor package of FIG. 21.

FIG. 22 is a schematic plan view taken along line VI-VI' of the fan-out semiconductor package of FIG. 21.

Referring to the drawings, a fan-out semiconductor package 100F according to another exemplary embodiment in the present disclosure may include a plurality of through-holes 110Ha and 110Hb. A plurality of semiconductor chips 120a and 120b may be disposed in the plurality of through-holes 110Ha and 110Hb, respectively. The plurality of semiconductor chips 120a and 120b may be ICs the same as each other or may be ICs different from each other. An encapsulant 130 may cover a first connection member 110 and inactive surfaces of the plurality of semiconductor chips 120a and 120b, and fill spaces between walls of the respective through-holes 110Ha and 110Hb and side surfaces of the respective semiconductor chips 120a and 120b. The plurality of semiconductor chips 120a and 120b may include bodies 121a and 121b, connection pads 122a and 122b, and passivation layers 123a and 123b, respectively. The respective connection pads 122a and 122b may be redistributed through the first connection member 110 and a second connection member 140. A description, or the like, of other configurations and a manufacturing method except for the abovementioned configuration overlaps that described above, and is thus omitted.

Figure 23:
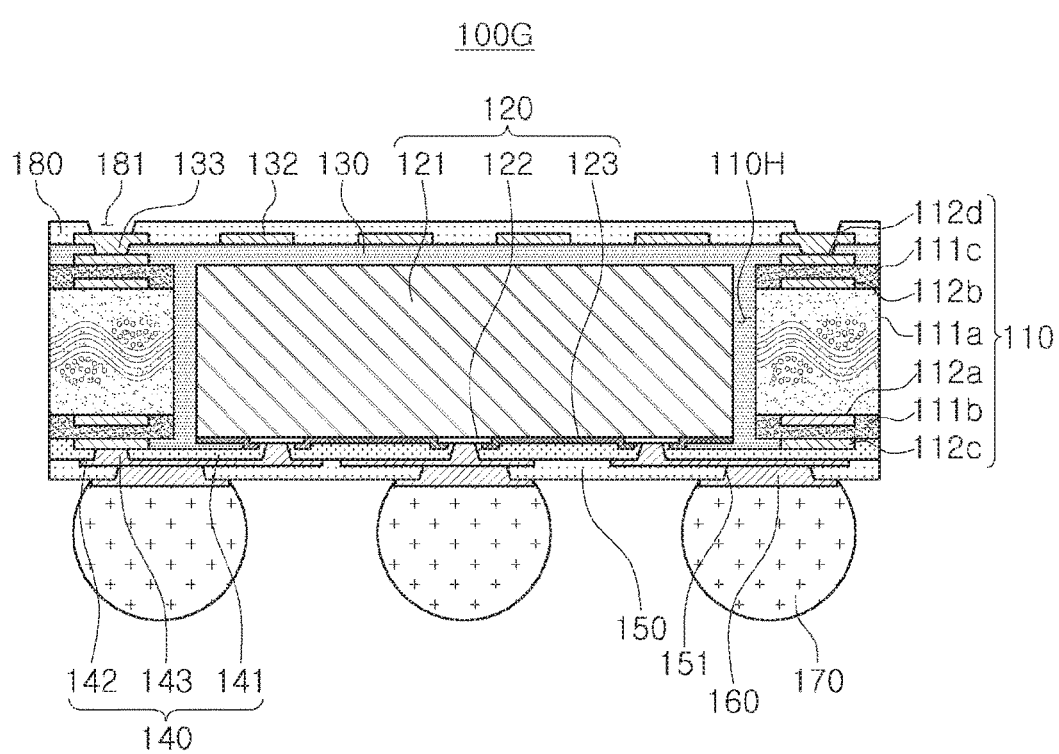
FIG. 23 is a schematic cross-sectional view illustrating another example of a fan-out semiconductor package.

FIG. 23 is a schematic cross-sectional view illustrating another example of a fan-out semiconductor package.

Referring to the drawing, in a fan-out semiconductor package 100G according to another exemplary embodiment in the present disclosure, a backside redistribution layer 132 may be disposed on an encapsulant 130. The backside redistribution layer 132 may be electrically connected to a fourth redistribution layer 112d of a first connection member 110 through backside vias 133 penetrating through the encapsulant 130. In addition, a resin layer 180 having openings 181 exposing portions of the backside redistribution layer 132 may be disposed on the encapsulant 130. Separate surface mounted technology (SMT) components may be disposed in the openings 181 and be electrically connected to the backside redistribution layer 132. Alternatively, connection terminals such as solder balls, or the like, may be further disposed in the openings 181. A description, or the like, of other configurations and a manufacturing method except for the abovementioned configuration overlaps that described above, and is thus omitted.

Figure 24:
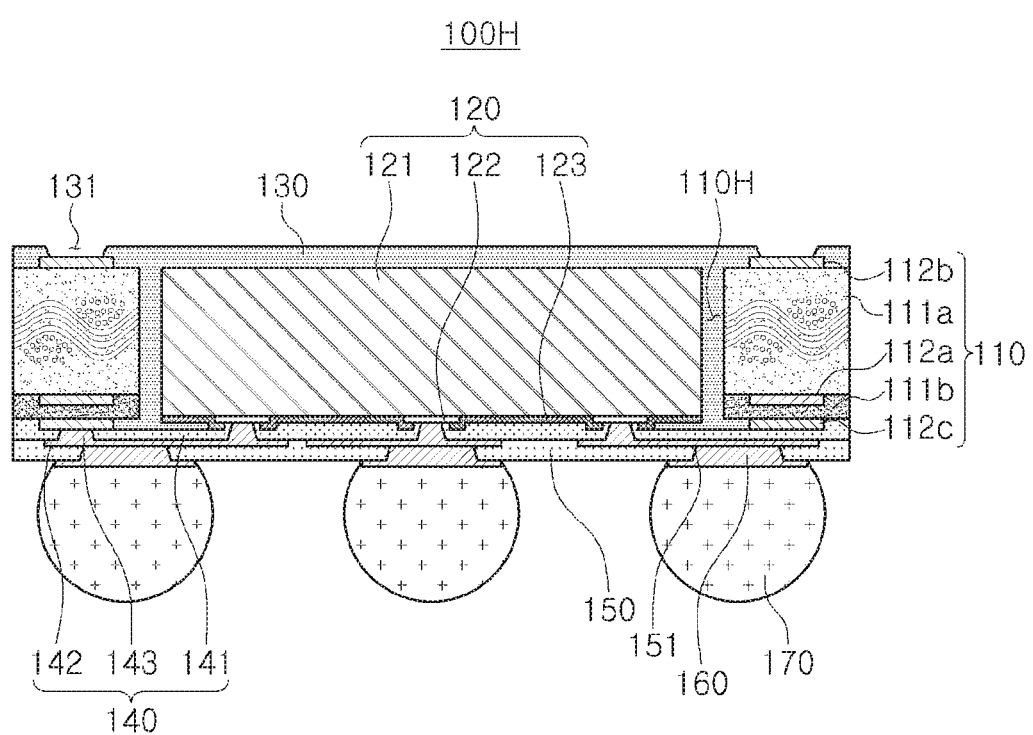
FIG. 24 is a schematic cross-sectional view illustrating another example of a fan-out semiconductor package.

FIG. 24 is a schematic cross-sectional view illustrating another example of a fan-out semiconductor package.

Referring to the drawing, in a fan-out semiconductor package 100H according to another exemplary embodiment in the present disclosure, a first connection member 110 may not include a third insulating layer 111c and a fourth redistribution layer 112d. That is, only a second insulating layer 111b covering a first redistribution layer 112a and a third redistribution layer 112c disposed on the second insulating layer 111b may be formed on a first insulating layer 111a, depending on a design. In this case, a second redistribution layer 112b formed on the first insulating layer 111a may be a redistribution layer corresponding to the uppermost layer of the first connection member 110. At least portions of the second redistribution layer 112b may be exposed through openings 131 of an encapsulant 130, and the contents of the fourth redistribution layer 112d described above may be applied as contents of the second redistribution layer 112b. A description, or the like, of other configurations and a manufacturing method except for the abovementioned configuration overlaps that described above, and is thus omitted.

Figure 25:
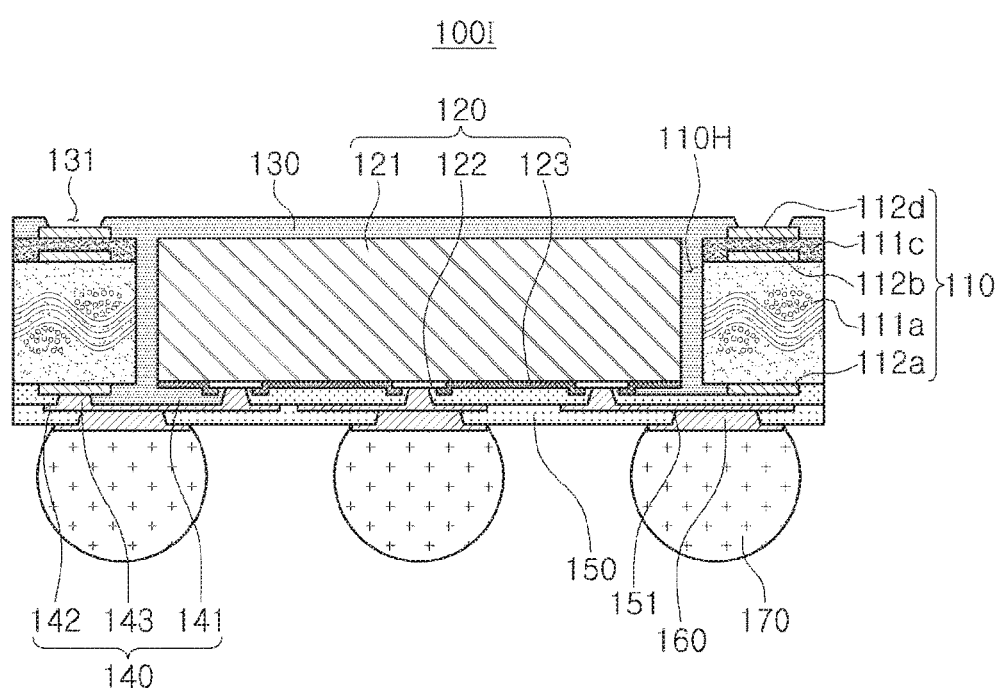
FIG. 25 is a schematic cross-sectional view illustrating another example of a fan-out semiconductor package.

FIG. 25 is a schematic cross-sectional view illustrating another example of a fan-out semiconductor package.

Referring to the drawing, in a fan-out semiconductor package 100I according to another exemplary embodiment in the present disclosure, a first connection member 110 may not include a second insulating layer 111b and a third redistribution layer 112c. That is, only a third insulating layer 111c covering a first redistribution layer 112a and a fourth redistribution layer 112d disposed on the third insulating layer 111c may be formed on a first insulating layer 111a, depending on a design. In this case, the second redistribution layer 112b formed on the first insulating layer 111a may be a redistribution layer corresponding to the lowermost layer contacting a second connection member 140. As contents depending on a disposition of the second redistribution layer 112b, the contents of the third redistribution layer 112c described above may be applied. A description, or the like, of other configurations and a manufacturing method except for the abovementioned configuration overlaps that described above, and is thus omitted.

Figure 26:
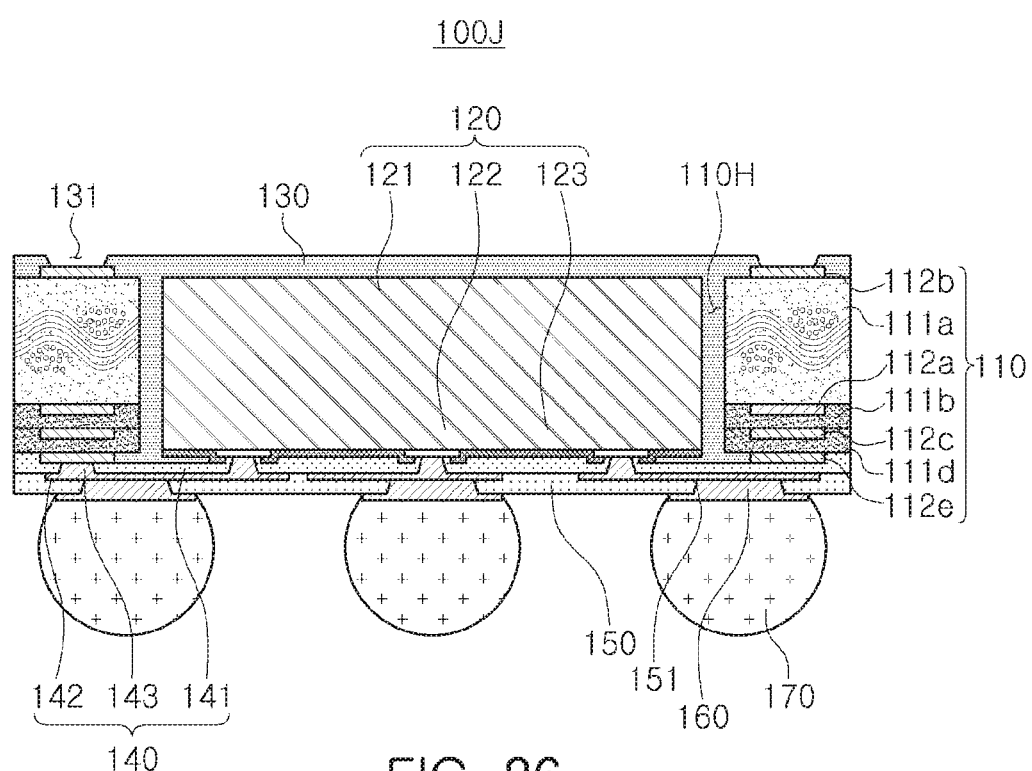
FIG. 26 is a schematic cross-sectional view illustrating another example of a fan-out semiconductor package.

FIG. 26 is a schematic cross-sectional view illustrating another example of a fan-out semiconductor package.

Referring to the drawing, in a fan-out semiconductor package 100J according to another exemplary embodiment in the present disclosure, a first connection member 110 may not include a third insulating layer 111c and a fourth redistribution layer 112d. That is, only a second insulating layer 111b covering a first redistribution layer 112a and a third redistribution layer 112c disposed on the second insulating layer 111b may be formed on a first insulating layer 111a, depending on a design. Instead, the first connection member 110 may further include a fourth insulating layer 111d disposed on the second insulating layer 111b and covering a third redistribution layer 112c. In addition, the first connection member 110 may further include a fifth redistribution layer 112e disposed on the fourth insulating layer 111d. In this case, a second redistribution layer 112b formed on the first insulating layer 111a may be a redistribution layer corresponding to the uppermost layer of the first connection member 110. At least portions of the second redistribution layer 112b may be exposed through openings 131 of an encapsulant 130, and the contents of the fourth redistribution layer 112d described above may be applied as contents of the second redistribution layer 112b. The fifth redistribution layer 112e formed on the fourth insulating layer 111d may be a redistribution layer corresponding to the lowermost layer contacting a second connection member 140. As contents depending on a disposition of the fifth redistribution layer 112e, the contents of the third redistribution layer 112c described above may be applied. As contents depending on a disposition of the third redistribution layer 112c formed on the second insulating layer 111b, the contents of the first redistribution layer 112a described above may be applied. A description, or the like, of other configurations and a manufacturing method except for the abovementioned configuration overlaps that described above, and is thus omitted.

Figure 27:
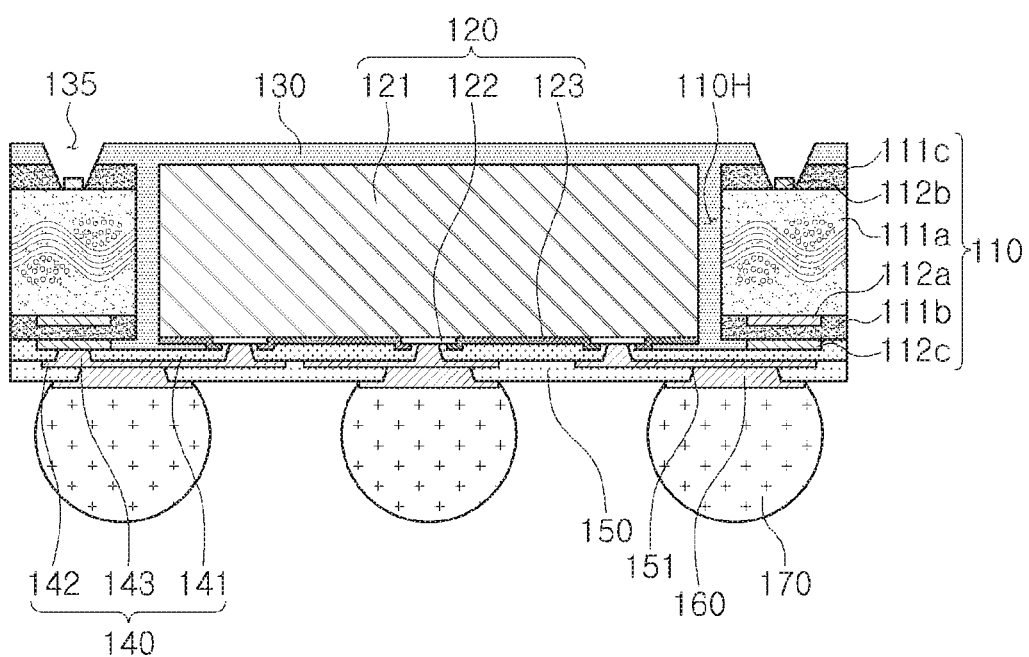
FIG. 27 is a schematic cross-sectional view illustrating another example of a fan-out semiconductor package.

FIG. 27 is a schematic cross-sectional view illustrating another example of a fan-out semiconductor package.

Referring to the drawing, in a fan-out semiconductor package 100K according to another exemplary embodiment in the present disclosure, a first connection member 110 may not include a fourth redistribution layer 112d. Instead, the first connection member 110 may include openings 135 penetrating through an encapsulant 130 and a third insulating layer 111c. The openings 135 may expose at least portions of the second redistribution layer 112b. Patterns of the second redistribution layer 112b exposed by the openings 135 may be wire bonding pad patterns. In this case, a memory chip, or the like, may be directly mounted on the fan-out semiconductor package 100K without using an interposer substrate, and redistribution of connection pads of the memory chip may be performed through the first connection member 110. Therefore, thinness of a package-on-package structure may be possible. A description, or the like, of other configurations and a manufacturing method except for the abovementioned configuration overlaps that described above, and is thus omitted.

Figure 28:
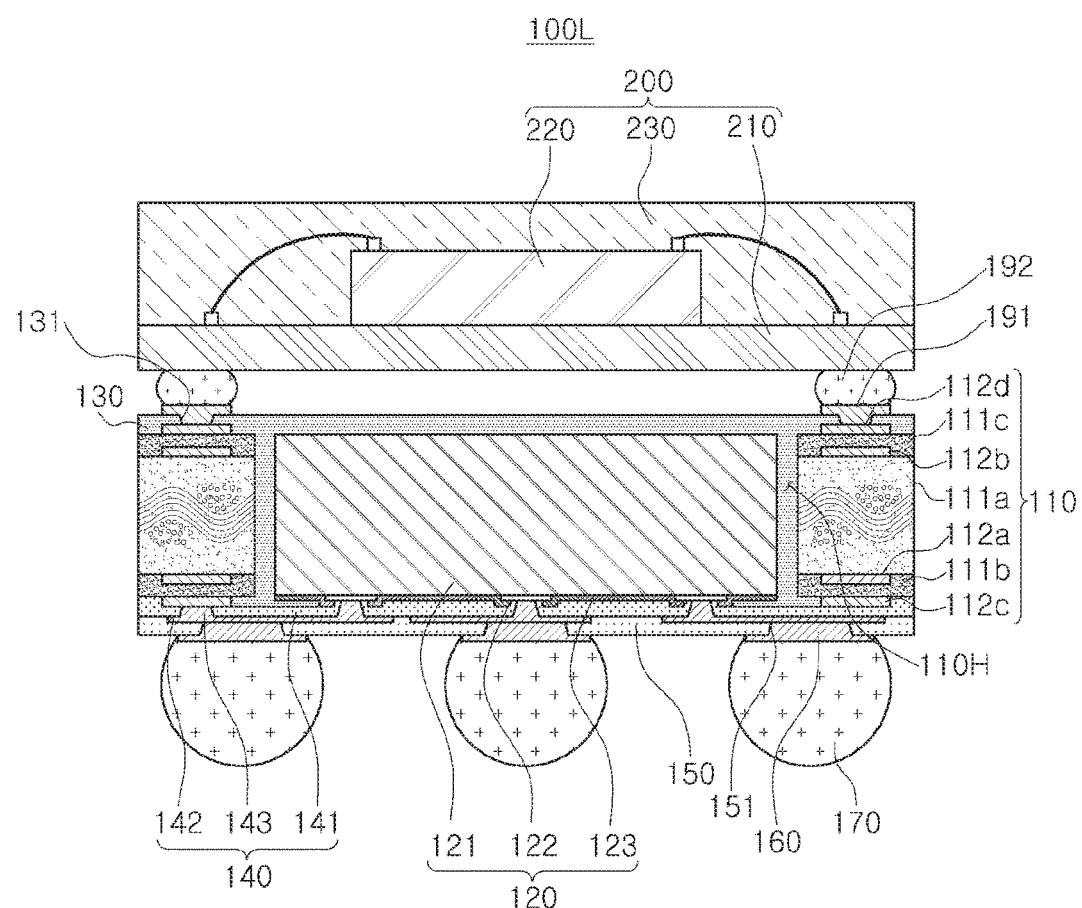
FIG. 28 is a schematic cross-sectional view illustrating another example of a fan-out semiconductor package.

FIG. 28 is a schematic cross-sectional view illustrating another example of a fan-out semiconductor package.

Referring to the drawings, in a fan-out semiconductor package 100L according to another exemplary embodiment in the present disclosure, a memory package 200 may be stacked on an encapsulant 130. That is, the fan-out semiconductor package 100L may have a package-on-package structure. The memory package 200 may be electrically connected to a first connection member 110 through an underbump metal layer 191 formed in openings 131 of the encapsulant 130 exposing a portion of patterns of a fourth redistribution layer 112d of the first connection member 110 and connection terminals 192 formed on the underbump metal layer 191. The memory package 200 may include a wiring substrate 210, a memory chip 220 mounted in a flip-chip form on the wiring substrate 210, and an encapsulant 230 encapsulating the memory chip 220. The wiring substrate 210 may be the known interposer substrate, and the memory chip 220 may be a volatile memory (such as a dynamic random access memory (DRAM)), a non-volatile memory (such as a read only memory (ROM)), a flash memory, or the like, but is not limited thereto. A description, or the like, of other configurations and a manufacturing method except for the abovementioned configuration overlaps that described above, and is thus omitted.

Figure 29:
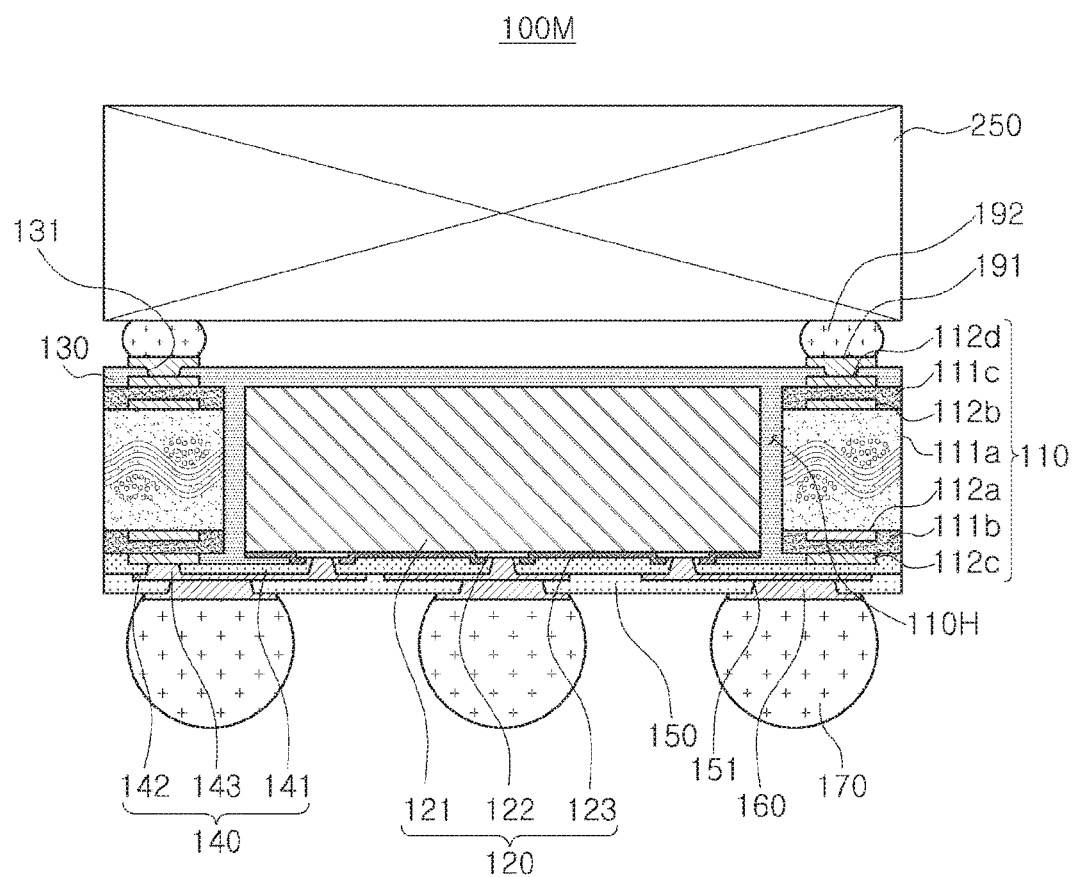
FIG. 29 is a schematic cross-sectional view illustrating another example of a fan-out semiconductor package.

FIG. 29 is a schematic cross-sectional view illustrating another example of a fan-out semiconductor package.

Referring to the drawings, in a fan-out semiconductor package 100M according to another exemplary embodiment in the present disclosure, a separate semiconductor package 250 may be stacked on an encapsulant 130. That is, the fan-out semiconductor package 100M may have a package-on-package structure. The semiconductor package 250 may be electrically connected to a first connection member 110 through an underbump metal layer 191 formed in openings 131 of the encapsulant 130 exposing a portion of patterns of a fourth redistribution layer 112d of the first connection member 110 and connection terminals 192 formed on the underbump metal layer 191. The semiconductor package 250 may be various kinds of known semiconductor packages. A description, or the like, of other configurations and a manufacturing method except for the abovementioned configuration overlaps that described above, and is thus omitted.

Figure 30:
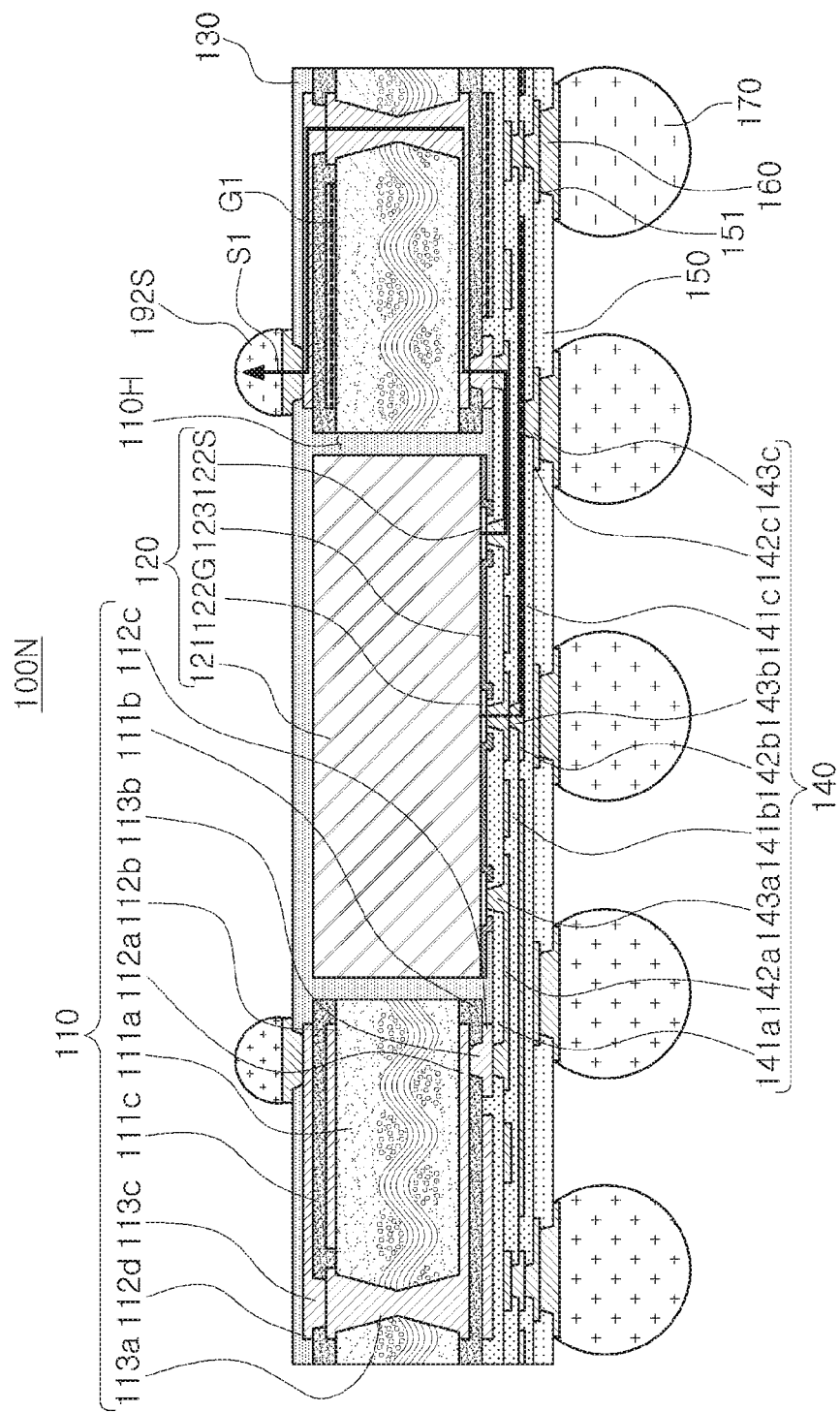
FIG. 30 is a schematic cross-sectional view illustrating another example of a fan-out semiconductor package.

FIG. 30 is a schematic cross-sectional view illustrating another example of a fan-out semiconductor package.

Referring to the drawing, in a fan-out semiconductor package 100N according to another exemplary embodiment in the present disclosure, a second connection member 140 may include a plurality of insulating layers 141a, 141b, and 141c, a plurality of redistribution layers 142a, 142b, and 142c, and a plurality of vias 143a, 143b, and 143c. In this case, a semiconductor chip 120 may have signal connection pads 122S. These signal connection pads 122S may be electrically connected to signal connection terminals 192S disposed in a fan-out region on a first connection member 110 through an electrical path S1 passing through signal patterns of a first redistribution layer 142a of the second connection member 140, signal patterns of a first redistribution layer 112a of the first connection member 110, and signal patterns of a fourth redistribution layer 112d of the first connection member 110 in this sequence or a sequence opposite to this sequence. In addition, the semiconductor chip 120 may have ground connection pads 122G. These ground connection pads 122G may be electrically connected to ground patterns of a second redistribution layer 142b of the second connection member 140, ground patterns of a third redistribution layer 112c of the first connection member 110, and ground patterns of a second redistribution layer 112b of the first connection member 110. The ground patterns may be disposed in an upper portion and a lower portion of the electrical path S1 to thus provide a return path G1 of the electrical path S1. As described above, the first connection member 110 may be utilized as a redistribution region for the signal pattern, the ground pattern, and the like, and since the first connection member 110 may be formed before the semiconductor chip 120 is disposed, a process yield, or the like, may be improved. The ground pattern may have a plate shape, or the like, but is not limited thereto.

Figure 31:
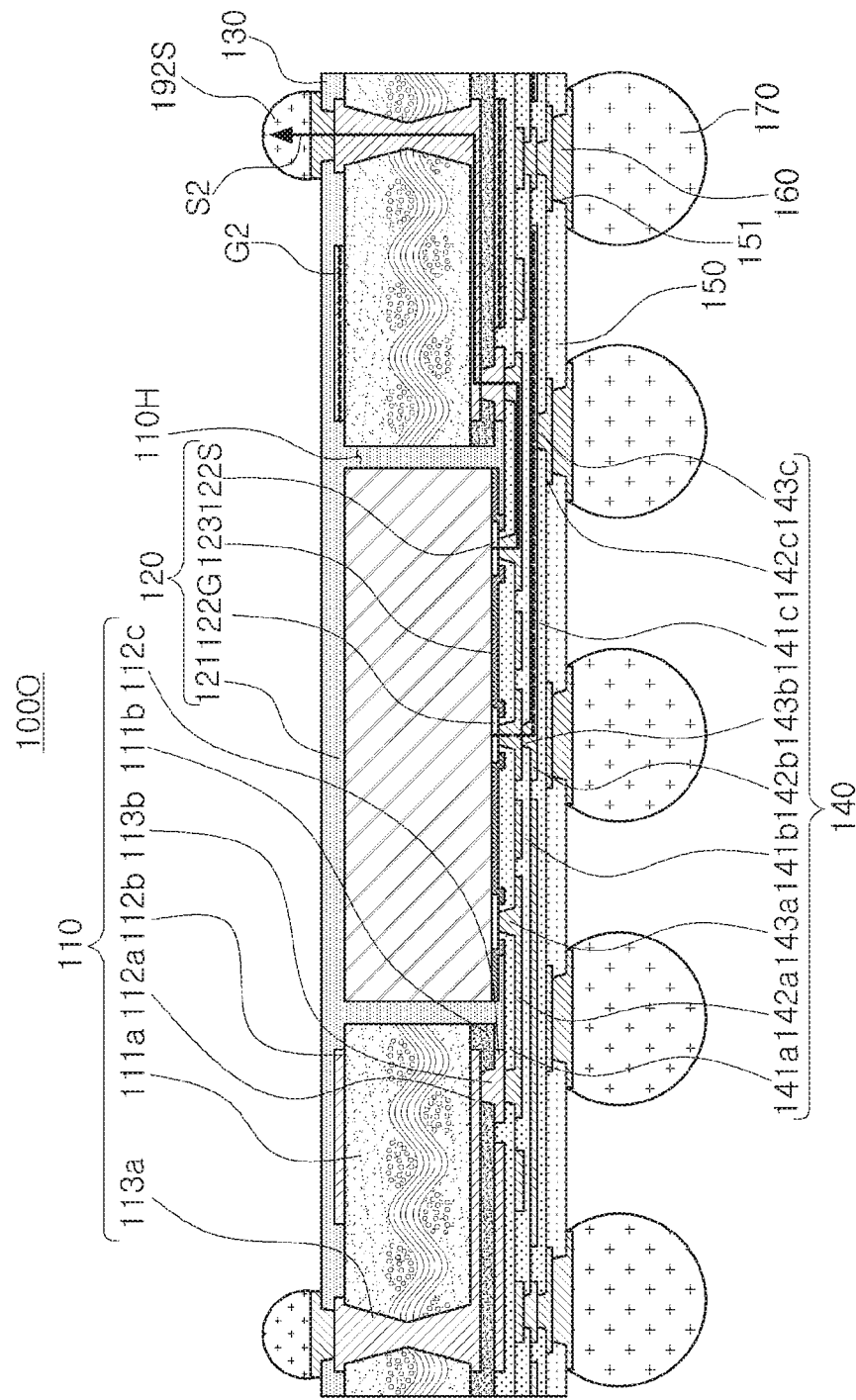
FIG. 31 is a schematic cross-sectional view illustrating another example of a fan-out semiconductor package.

FIG. 31 is a schematic cross-sectional view illustrating another example of a fan-out semiconductor package.

Referring to the drawing, in a fan-out semiconductor package 100O according to another exemplary embodiment in the present disclosure, a second connection member 140 may include a plurality of insulating layers 141a, 141b, and 141c, a plurality of redistribution layers 142a, 142b, and 142c, and a plurality of vias 143a, 143b, and 143c. In addition, a first connection member 110 may not include a third insulating layer 111c and a fourth redistribution layer 112d. In this case, a semiconductor chip 120 may have signal connection pads 122S. These signal connection pads 122S may be electrically connected to signal connection terminals 192S disposed in a fan-out region on the first connection member 110 through an electrical path S2 passing through signal patterns of a first redistribution layer 142a of the second connection member 140 and signal patterns of a first redistribution layer 112a of the first connection member 110 in this sequence or a sequence opposite to this sequence. In addition, the semiconductor chip 120 may have ground connection pads 122G. These ground connection pads 122G may be electrically connected to ground patterns of a second redistribution layer 142b of the second connection member 140, ground patterns of a third redistribution layer 112c of the first connection member 110, and ground patterns of a second redistribution layer 112b of the first connection member 110. The ground patterns may be disposed at an upper portion and a lower portion of the electrical path S2 to thus provide a return path G2 of the electrical path S2. As described above, the first connection member 110 may be utilized as a redistribution region for the signal pattern, the ground pattern, and the like, and since the first connection member 110 may be formed before the semiconductor chip 120 is disposed, a process yield, or the like, may be improved. The ground pattern may have a plate shape, or the like, but is not limited thereto.

Figure 32:
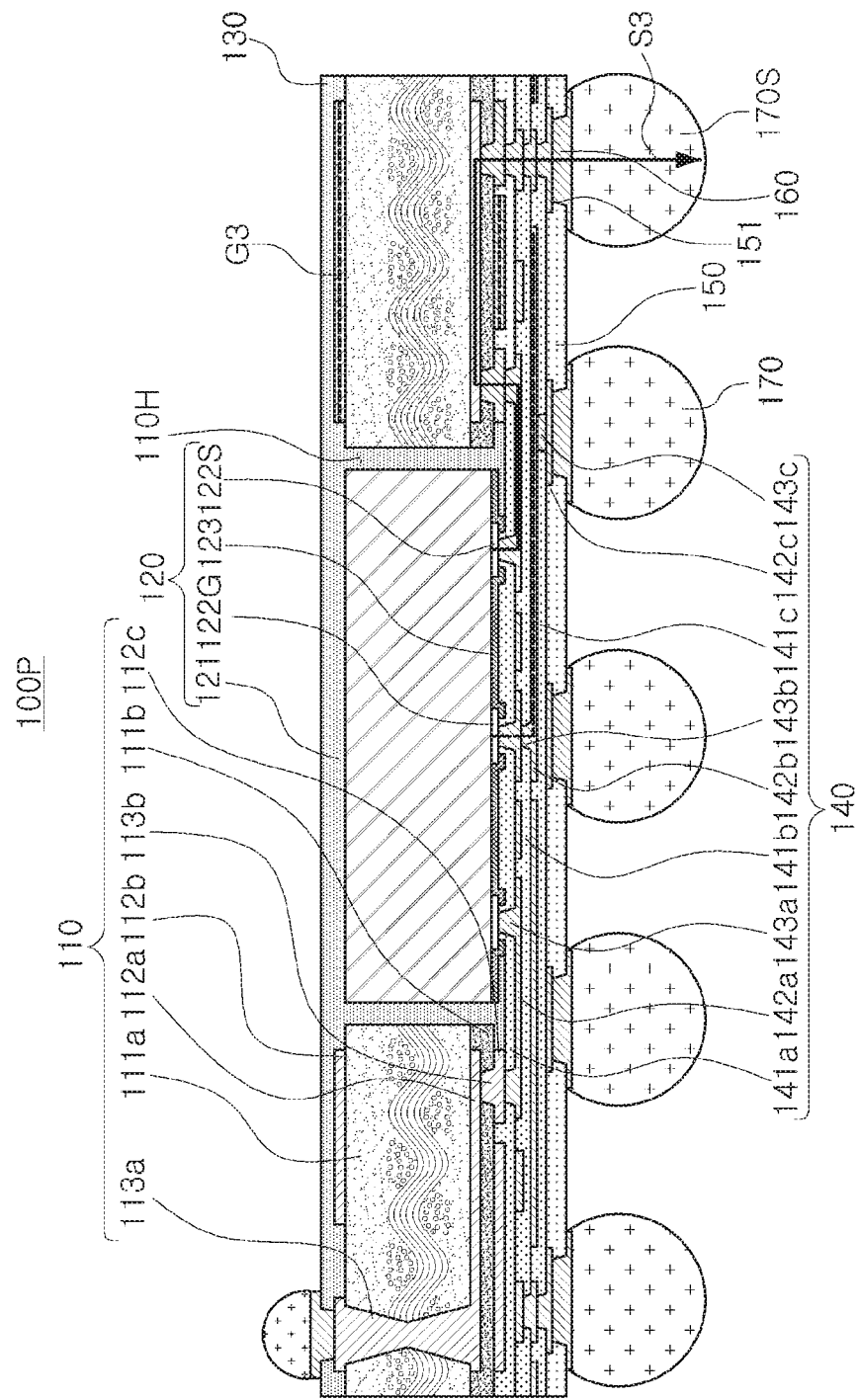
FIG. 32 is a schematic cross-sectional view illustrating another example of a fan-out semiconductor package.

FIG. 32 is a schematic cross-sectional view illustrating another example of a fan-out semiconductor package.

Referring to the drawing, in a fan-out semiconductor package 100P according to another exemplary embodiment in the present disclosure, a second connection member 140 may include a plurality of insulating layers 141a, 141b, and 141c, a plurality of redistribution layers 142a, 142b, and 142c, and a plurality of vias 143a, 143b, and 143c. In addition, a first connection member 110 may not include a third insulating layer 111c and a fourth redistribution layer 112d. In this case, a semiconductor chip 120 may have signal connection pads 122S. These signal connection pads 122S may be electrically connected to signal connection terminals 170S disposed in a fan-out region on the second connection member 140 through an electrical path S3 passing through signal patterns of the first redistribution layer 142a of the second connection member 140 and signal patterns of a first redistribution layer 112a of a first connection member 110 in this sequence or a sequence opposite to this sequence. In addition, the semiconductor chip 120 may have ground connection pads 122G. These ground connection pads 122G may be electrically connected to ground patterns of a second redistribution layer 142b of the second connection member 140, ground patterns of a third redistribution layer 112c of the first connection member 110, and ground patterns of a second redistribution layer 112b of the first connection member 110. The ground patterns may be disposed at an upper portion and a lower portion of the electrical path S3 to thus provide a return path G3 of the electrical path S3. As described above, the first connection member 110 may be utilized as a redistribution region for the signal pattern, the ground pattern, and the like, and since the first connection member 110 may be formed before the semiconductor chip 120 is disposed, a process yield, or the like, may be improved. The ground pattern may have a plate shape, or the like, but is not limited thereto.

As set forth above, according to an exemplary embodiment in the present disclosure, a fan-out semiconductor package in which a decrease in a yield of a semiconductor chip is significantly suppressed, and a method of manufacturing the same may be provided.

While exemplary embodiments have been shown and described above, it will be apparent to those skilled in the art that modifications and variations could be made without departing from the scope of the present invention as defined by the appended claims.

What is claimed is:

1. A semiconductor package, comprising:
a frame having a through-hole;
a semiconductor chip disposed in the through-hole and having an active surface having connection pads disposed thereon and an inactive surface opposing the active surface;
an encapsulant encapsulating at least portions of the frame and the inactive surface of the semiconductor chip and extending continuously from regions covering the at least portions of the frame and the inactive surface of the semiconductor chip to portions of the through-hole of the frame; and
a redistribution part disposed on the frame and the active surface of the semiconductor chip and including a redistribution layer electrically connected to the connection pads,
wherein the frame includes a first insulating layer, a first redistribution layer and a second redistribution layer disposed on one surface and the other surface of the first insulating layer opposing the one surface thereof, respectively, a second insulating layer disposed on the first insulating layer and covering the first redistribution layer, and a third redistribution layer disposed on the second insulating layer, and
the first to third redistribution layers of the frame are electrically connected to the connection pads.

2. The semiconductor package of claim 1, wherein the first insulating layer has a thickness greater than that of the second insulating layer.

3. The semiconductor package of claim 1, wherein the third redistribution layer has a thickness greater than that of the redistribution layer of the redistribution part.

4. The semiconductor package of claim 3, wherein the third redistribution layer is interposed between the first insulating layer and the redistribution part.

5. The semiconductor package of claim 1, wherein the third redistribution layer is disposed on a level that is substantially the same as that of the connection pad.

6. The semiconductor package of claim 1, wherein the first redistribution layer is disposed on a level between the active surface and the inactive surface of the semiconductor chip.

7. The semiconductor package of claim 1, wherein the frame further includes a third insulating layer disposed on the first insulating layer and covering the second redistribution layer and a fourth redistribution layer disposed on the third insulating layer, and
the fourth redistribution layer is electrically connected to the connection pads.

8. The semiconductor package of claim 1, wherein the first insulating layer has a thickness greater than that of the second insulating layer and the third insulating layer.

9. The semiconductor package of claim 7, wherein the semiconductor chip has signal connection pads,
the signal connection pads are electrically connected to signal connection terminals disposed in a fan-out region on the frame through an electrical path passing through signal patterns of the redistribution layer of the redistribution part, signal patterns of the first redistribution layer of the frame, and signal patterns of the fourth redistribution layer of the frame, and
the second and third redistribution layers of the frame have ground patterns.

10. The semiconductor package of claim 1, wherein the semiconductor chip has signal connection pads,
the signal connection pads are electrically connected to signal connection terminals disposed in a fan-out region on the frame through an electrical path passing through signal patterns of the redistribution layer of the redistribution part and signal patterns of the first redistribution layer of the frame, and
the second and third redistribution layers of the frame have ground patterns.

11. The semiconductor package of claim 1, wherein the semiconductor chip has signal connection pads,
the signal connection pads are electrically connected to signal connection terminals disposed in a fan-out region on the redistribution part through an electrical path passing through signal patterns of the redistribution layer of the redistribution part and signal patterns of the first redistribution layer of the frame, and
the second and third redistribution layers of the frame have ground patterns.

12. The semiconductor package of claim 1, wherein the second redistribution layer has bonding pads exposed externally.

13. The semiconductor package of claim 1, wherein the frame further includes a first via penetrating through the first insulating layer and connecting the first and second redistribution layers to each other and a second via penetrating through the second insulating layer and connecting the first and third redistribution layers to each other, and
the first via has a diameter greater than that of the second via.

14. The semiconductor package of claim 1, wherein the first insulating layer has a modulus of elasticity greater than that of the second insulating layer.

15. The semiconductor package of claim 1, wherein the frame further includes a metal layer disposed on a wall of the through-hole.

16. The semiconductor package of claim 1, further comprising a passive electronic component disposed in the through-hole.

17. The semiconductor package of claim 1, wherein the encapsulant includes a core material, an inorganic filler, and an insulating resin.

18. The semiconductor package of claim 1, further comprising:
a passivation layer disposed on the redistribution part and having openings exposing at least portions of the redistribution layer of the redistribution part; and connection terminals disposed in the openings,
wherein at least one of the connection terminals is disposed in a fan-out region.

19. The semiconductor package of claim 1, further comprising a backside redistribution layer disposed on the encapsulant and electrically connected to the frame through a backside via penetrating through the encapsulant.

20. The semiconductor package of claim 19, further comprising a resin layer disposed on the encapsulant and having openings exposing at least portions of the backside redistribution layer.

21. The semiconductor package of claim 1, further comprising a memory package stacked on the encapsulant and electrically connected to the frame,
wherein the semiconductor chip includes an application processor chip, and
the memory package includes a memory chip.

22. The semiconductor package of claim 1, wherein the encapsulant fills a portion of a space between the semiconductor chip and the redistribution part.

23. The semiconductor package of claim 1, wherein the through-hole penetrates through each insulating layer of the frame.

24. A semiconductor package comprising:
a semiconductor chip having an active surface having connection pads disposed thereon and an inactive surface opposing the active surface;
a frame including two or more units spaced-apart from each other and disposed adjacently to the semiconductor chip; and
a redistribution part disposed on the two or more units and the semiconductor chip,
wherein each of the two or more units includes a first insulating layer and a second insulating layer disposed on the first insulating layer,
one of the two or more units further includes a first redistribution layer and a second redistribution layer disposed on opposite surfaces of the first insulating layer thereof and a third redistribution layer disposed on the second insulating layer, the first redistribution layer of the one of the two or more units being covered by the second insulating layer of the one of the two or more units,
the redistribution part includes an insulating layer and a redistribution layer disposed on the insulating layer, and
the first to third redistribution layers of the one of the two or more units and the redistribution layer of the redistribution part are electrically connected to the connection pads of the semiconductor chip.

25. The semiconductor package of claim 24, wherein the first insulating layer has a thickness greater than that of the second insulating layer.

26. The semiconductor package of claim 24, wherein each of the two or more units further includes a third insulating layer disposed on the first insulating layer thereof,
the third insulating layer of the one of the two or more units covers the second redistribution layer of the one of the two or more units,
the one of the two or more units further includes a fourth redistribution layer disposed on the third insulating layer of the one of the two or more units, and
the fourth redistribution layer is electrically connected to the connection pads.

27. The semiconductor package of claim 26, wherein the first insulating layer has a thickness greater than that of the second insulating layer and the third insulating layer.

28. The semiconductor package of claim 24, further comprising an encapsulant encapsulating at least portions of the two or more units and the inactive surface of the semiconductor chip.

29. The semiconductor package of claim 28, wherein the encapsulant has openings exposing at least portions of the fourth redistribution layer.

30. The semiconductor package of claim 28, wherein the encapsulant encapsulates the entirety of side surfaces of the two or more units.

31. The semiconductor package of claim 28, wherein the encapsulant extends continuously from regions covering the at least portions of the two or more units and the inactive surface of the semiconductor chip to portions of spaces between the semiconductor chip and the two or more units.

32. A semiconductor package, comprising:
a frame having a through-hole and including a first insulating layer, and first and second redistribution layers disposed on opposite surfaces of the first insulating layer;
a semiconductor chip disposed in the through-hole and having an active surface having connection pads disposed thereon and an inactive surface opposing the active surface;
a redistribution part disposed on a lower surface of the frame and the active surface of the semiconductor chip and including a redistribution layer; and
an encapsulant encapsulating at least portions of an upper surface of the frame opposing the lower surface of the frame and the inactive surface of the semiconductor chip and extending continuously from regions covering the at least portions of the upper surface of the frame and the inactive surface of the semiconductor chip to a region between the redistribution part and the semiconductor chip,
wherein at least one of the first and second redistribution layers of the frame is electrically connected to the connection pads via the redistribution layer of the redistribution part.

33. The semiconductor package of claim 32, wherein the redistribution part further includes an insulating layer disposed between the redistribution layer thereof and the semiconductor chip, and
the insulating layer of the redistribution part and a portion of the encapsulant extending to the region between the redistribution part and the semiconductor chip contact a passivation layer of the semiconductor chip.

34. The semiconductor package of claim 32, wherein the frame further includes a plurality of insulating layers each having a thickness less than that of the first insulating layer.

35. The semiconductor package of claim 34, wherein the through-hole penetrates through the first insulating layer and the plurality of insulating layers.

36. The semiconductor package of claim 32, wherein the frame further includes a plurality of insulating layers each having a modulus of elasticity less than that of the first insulating layer, and
a modulus of elasticity of the encapsulant is less than that of the first insulating layer.

37. The semiconductor package of claim 32, wherein any redistribution layer of the frame has a thickness greater than that of any redistribution layer of the redistribution part.

38. The semiconductor package of claim 32, wherein the frame includes one redistribution layer which is disposed on a level that is substantially the same as that of the connection pad.

39. The semiconductor package of claim 32, wherein at least one of the first and second redistribution layers of the frame is disposed on a level between the active surface and the inactive surface of the semiconductor chip.

40. The semiconductor package of claim 32, wherein the encapsulant extends continuously from the regions covering the at least portions of the frame and the inactive surface of the semiconductor chip to a region between the redistribution part and the frame.

* * * * *